US009919921B2

(12) United States Patent
Bright et al.

(10) Patent No.: US 9,919,921 B2
(45) Date of Patent: Mar. 20, 2018

(54) METHODS OF PREPARING NANODEVICES

(71) Applicants: The Regents of the University of Colorado, a body corporate, Denver, CO (US); DRS Network & Imaging Systems, LLC, Dallas, TX (US)

(72) Inventors: Victor M. Bright, Boulder, CO (US); Steven George, Boulder, CO (US); Joseph J. Brown, Boulder, CO (US); Nathan T. Eigenfeld, Boulder, CO (US); Jason M. Gray, Hillsboro, OR (US); George Dee Skidmore, Richardson, TX (US)

(73) Assignees: The Regents of the University of Colorado, a body corporate, Denver, CO (US); DRS Network & Imaging Systems, LLC, Dallas, TX (US)

( * ) Notice: Subject to any disclaimer, the term of this patent is extended or adjusted under 35 U.S.C. 154(b) by 173 days.

(21) Appl. No.: 14/604,896

(22) Filed: Jan. 26, 2015

(65) Prior Publication Data

US 2016/0304341 A1    Oct. 20, 2016

Related U.S. Application Data

(60) Provisional application No. 61/931,292, filed on Jan. 24, 2014.

(51) Int. Cl.
*H01L 21/20*    (2006.01)
*B82B 3/00*    (2006.01)
(Continued)

(52) U.S. Cl.
CPC .............. *B82B 3/008* (2013.01); *B05D 3/145* (2013.01); *B05D 7/24* (2013.01); *B81C 1/0019* (2013.01);
(Continued)

(58) Field of Classification Search
CPC .......... H01L 21/0228; H01L 21/28194; H01L 21/3141
(Continued)

(56) References Cited

U.S. PATENT DOCUMENTS

2006/0281321 A1* 12/2006 Conley, Jr. et al. ....................... B81C 1/00182
438/703
2010/0038731 A1    2/2010 Van Kampen et al.
(Continued)

OTHER PUBLICATIONS

PCT International Search Report and Written Opinion for PCT International Application No. PCT/US2015/012815 dated Oct. 5, 2015.
(Continued)

*Primary Examiner* — Tan N Tran
(74) *Attorney, Agent, or Firm* — Saul Ewing Arnstein & Lehr LLP; Kathryn Doyle; Domingos J. Silva

(57) ABSTRACT

The present invention relates to novel nano- and micro-electromechanical devices and novel methods of preparing them. In one aspect, the invention includes methods of preparing a nanodevice. In certain embodiments, the methods comprise coating a polymer layer with a first at least one thin solid material layer using atomic layer deposition (ALD), thus forming an ALD-generated layer. In other embodiments, the methods comprise patterning the first at least one thin solid material layer to form a nanodevice. In yet other embodiments, the methods comprise releasing the nanodevice from the polymer layer.

44 Claims, 14 Drawing Sheets

(51) Int. Cl.
| | |
|---|---|
| B81C 1/00 | (2006.01) |
| B05D 3/14 | (2006.01) |
| B05D 7/24 | (2006.01) |
| B82B 1/00 | (2006.01) |
| C23C 16/01 | (2006.01) |
| C23C 16/02 | (2006.01) |
| C23C 16/14 | (2006.01) |
| C23C 16/40 | (2006.01) |
| C23C 16/455 | (2006.01) |
| C23C 16/56 | (2006.01) |
| B82Y 30/00 | (2011.01) |

(52) U.S. Cl.
CPC .......... *B81C 1/00492* (2013.01); *B82B 1/005* (2013.01); *C23C 16/01* (2013.01); *C23C 16/0245* (2013.01); *C23C 16/14* (2013.01); *C23C 16/403* (2013.01); *C23C 16/45525* (2013.01); *C23C 16/45555* (2013.01); *C23C 16/56* (2013.01); *B82Y 30/00* (2013.01); *C23C 16/45553* (2013.01); *H01L 2924/0002* (2013.01)

(58) Field of Classification Search
USPC .......................................... 438/256, 384, 674
See application file for complete search history.

(56) References Cited

U.S. PATENT DOCUMENTS

| | | |
|---|---|---|
| 2010/0171190 A1 | 7/2010 | Liger et al. |
| 2011/0073827 A1 | 3/2011 | Rubloff et al. |
| 2012/0139078 A1 | 6/2012 | Malm et al. |
| 2013/0022077 A1 | 1/2013 | Harmon et al. |
| 2013/0234270 A1 | 9/2013 | Yama et al. |
| 2014/0093688 A1* | 4/2014 | Chuo .................. H01L 21/3086 428/156 |

OTHER PUBLICATIONS

Davami, et al., "ALD Honeycomb Plates Enabling Robust Ultrathin MEMS", Micro Electro Mechanical Systems, 2014, 449-452.
Davidson, et al., "ALD tungsten NEMS switches and tunneling devices", Sensors and Actuators A: Physical 166, 2011, 269-276.
Davidson, et al., "Atomic Layer Deposition (ALD) Tungsten NEMS Devices Via a Novel Top-Down Approach", Micro Electro Mechanical Systems, 2009, 120-123.
Purkl, et al., "Serpentine Geometry for Enhanced Performance of Nanometer-Thin Platinum Bolometers", Solid-State Sensors, Actuators and Microsystems (Transducers & Eurosensors XXVII), 2013, 1507-1510.
Purkl, et al., "Sub-10 Nanometer Uncooled Platinum Bolometers Via Plasma Enhanced Atomic Layer Deposition", Micro Electro Mechanical Systems, 2013, 185-188.
Sainiemi, et al., "Suspended nanostructured alumina membranes", Nanotechnology 20, 2009, 1-6.
Yoneoka, et al., "ALD-Metal Uncooled Bolometer", Micro Electro Mechanical Systems, 2011, 676-679.

* cited by examiner

METHODS OF PREPARING NANODEVICES

CROSS-REFERENCE TO RELATED APPLICATIONS

The present application claims priority under 35 U.S.C. § 119(e) to U.S. Provisional Patent Application No. 61/931,292, filed Jan. 24, 2014, which is incorporated herein by reference in its entirety.

STATEMENT REGARDING FEDERALLY SPONSORED RESEARCH OR DEVELOPMENT

This invention was made with government support under grant number N66001-10-1-4007 awarded by DOD/DARPA. The government has certain rights in the invention.

BACKGROUND OF THE INVENTION

There has been great interest in identifying novel methods of preparing nano- and micro-electromechanical devices.

Micro-electromechanical systems (MEMS) devices comprise components between about 1 to 100 μm in size (i.e., 0.001 to 0.1 mm), and MEMS devices generally range in size from 20 μm to 1.0 mm. Such devices may be prepared using modified semiconductor device fabrication technologies, which are commonly used to make electronics. Patterning of the device is usually achieved using techniques such as lithography, photolithography, etching processes (e.g., wet etching using for example potassium hydroxide, tetramethylammonium hydroxide, or hydrogen fluoride; dry etching using for example vapor etching with xenon difluoride or hydrogen fluoride, or plasma etching), electrodischarge machining, and other technologies capable of manufacturing small devices.

Nano-electromechanical systems (NEMS) devices comprise components that have at least one dimension less than about 1 μm in size. Many of these devices have been carbon based, specifically diamond, carbon nanotubes and graphene. Key problems preventing the commercial application of nano-electromechanical devices have included low-yields and high device quality variability.

Atomic layer deposition (ALD) uses automated cycling of component gases to deposit solid materials conformally on solid surfaces. The growth of individual layers is a self-limiting reaction, resulting in linear growth of material, which is dependent upon the number of cycles to which a substrate is exposed. ALD allows thickness control and conformality unmatched by any other available industrial process. Moreover, ALD processes generally employ low temperatures, with typical deposition temperatures below 200° C. ALD materials currently available include ceramics ($Al_2O_3$, TaN, $SiO_2$, $HfO_2$, MgO, MnO), metals (W, Pt, Ru), semiconductors (ZnO, AlN), and various other inorganic materials. In the case where ALD processes generate amorphous polymer structures through sequential reactions that include organic molecules, this process is called molecular layer deposition (MLD), and allows controlled conformal deposition of an additional range of materials.

There is a need in the art for novel methods of preparing nano- and micro-electromechanical devices with specific structures. In one aspect, such methods should be reliable and allow for the preparation of devices with predetermined patterns. The present invention meets this need.

BRIEF SUMMARY OF THE INVENTION

The invention provides methods of preparing nanodevices. The invention further provides nanodevices prepared according to methods of the invention.

In certain embodiments, the method comprises coating at least a portion of a solid supporting material layer with a first at least one thin solid material layer using atomic layer deposition (ALD), thus forming an ALD-generated thin solid material layer. In other embodiments, the method comprises patterning (using a technique such as, but not limited to, etching) the first at least one thin solid material layer, thus forming a nanodevice. In yet other embodiments, the method comprises optionally performing the steps of: adding at least one additional solid supporting material layer to form at least one second-level solid supporting material layer; optionally patterning the at least one additional solid supporting material layer to create vias, trenches or other three-dimensional templates; coating the at least one additional patterned solid supporting material layer using ALD, thus forming at least one additional ALD-generated layer of thin solid material; and, patterning (e.g., etching) the at least one additional thin solid material layer to form the nanodevice. In yet other embodiments, patterning of the first or additional at least one thin solid material layer comprises photolithography or nanoimprint lithography in combination with etching. In yet other embodiments, the method comprises releasing at least a portion of the nanodevice from the one or more solid supporting material layers.

In certain embodiments, at least one selected from the group consisting of the solid supporting material layer and the additional solid supporting material layer(s) comprises at least one selected from the group consisting of a polyimide, a polymethyldisiloxane, a polystyrene, an epoxy, a polypropylene, a poly(methyl methacrylate), a polyethylene, and a poly(vinyl chloride). In other embodiments, at least one selected from the group consisting of the first solid supporting material layer and additional solid supporting material layer(s) is independently patterned. In yet other embodiments, at least one selected from the group consisting of the first and the additional ALD-generated layer(s) comprises at least one selected from the group consisting of a metal, a metal oxide, a semimetal, a semiconductor, and a metal nitride. In yet other embodiments, at least one selected from the group consisting of the first and additional ALD-generated layer(s) comprises at least one selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, $RuO_2$, Si, SiC, SiGe, $SiO_2$, $SnO_2$, Ta, Ti, TiN, $TiO_2$, $V_2O_5$, $VO_x$, W, ZnO, and $ZrO_2$. In yet other embodiments, at least one solid supporting material layer is deposited by at least one method selected from the group consisting of evaporation, electroplating, plasma enhanced chemical vapor evaporation, reactive ion beam deposition, and atomic layer deposition.

In certain embodiments, at least one selected from the group consisting of the first and additional ALD-generated layer(s) comprises a dielectric layer and/or a metal layer. In other embodiments, the dielectric layer comprises $Al_2O_3$. In yet other embodiments, metal layer comprises at least one selected from the group consisting of Ru, W, Ag, Au, Fe, Os, Pt, Pd, Cu, Ir, and Rh. In yet other embodiments, at least one selected from the group consisting of the first and additional ALD-generated layer(s) has a thickness ranging from about 0.1 nm to about 300 nm. In yet other embodiments, at least one selected from the group consisting of the first and additional ALD-generated layer(s) comprises at least two layers, each layer independently comprising Ru, W, Pt, $Al_2O_3$, $SiO_2$, ZnO, or $TiO_2$. In yet other embodiments, the removal step comprises at least partial removal of at least one solid supporting material layer by wet or dry etching.

In certain embodiments, the method further comprises at least one of the following steps: depositing and patterning an electrically conducting layer on a substrate; coating the electrically conducting layer with a polymer layer; patterning the polymer layer; and, optionally depositing an additional material layer on the patterned polymer layer, wherein the additional material layer is not generated using ALD, and patterning the non-ALD generated layer.

In certain embodiments, the substrate comprises at least one selected from the group consisting of Si, $SiO_2$, glass, $Si_3N_4$, sapphire, GaAs, SiC, and a solid organic material. In other embodiments, the electrically conducting layer comprises at least one selected from the group consisting of Ag, Al, Au, Cr, Cu, Ni, Pt, Si, Ti, Ta, W, and an alloy containing one or more of these metals.

In certain embodiments, the nanodevice is a bolometer, a transducer, a temperature sensor, a thermistor, a microbolometer, a microphone, a speaker, an ultrasonic transducer, a resistor, an inductor, a spiral inductor, a flagellum, a flagellum motor, a freestanding nanodevice, a freestanding microdevice, a Bragg reflector, a Bragg filter, an antenna, a terahertz detector, an electromagnetic transformer, or an electrical system. In other embodiments, the nanodevice is a radiation absorbing device or bolometer support structure. In yet other embodiments, the support structure comprising ALD-generated layers is connected to a non-ALD-generated transducing layer. In yet other embodiments, the radiation absorbing device is connected to the non-ALD-generated transducer layer and connected to the support structure and an underlying read-out integrated circuit to form an entire bolometer device. In yet other embodiments, the nanodevice has a heat capacity less than about 200 pJ/K.

In certain embodiments, the nanodevice selected from the group consisting of: (a) a nanodevice comprising at least two ALD-generated material layers and at least one electrically conducting solid material layer, wherein at least one of the ALD-generated material layers independently comprises an insulating material layer, and the remaining ALD-generated material layer independently comprises an electrically conducting ALD-generated material layer, wherein the at least one ALD-generated insulating material layer is located between the electrically conducting solid material layer and the electrically conducting ALD-generated material layer, wherein electrical connection takes place through the at least one ALD-generated insulating layer between the electrically conducting solid material layer and the electrically conducting ALD-generated material layers, allowing for electron transport between the electrically conducting layers of the nanodevice; and, (b) a nanodevice comprising at least two ALD-generated electrically conducting layers and at least one ALD-generated insulating material layer, wherein the at least one insulating material layer is located between the at least two ALD-generated electrically conducting layers, wherein electrical connection takes place between the conducting layers through the at least one insulating material layer, allowing electron transport between the at least two ALD-generated electrically conducting layers.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

DETAILED DESCRIPTION OF THE INVENTION

Figure 1A:
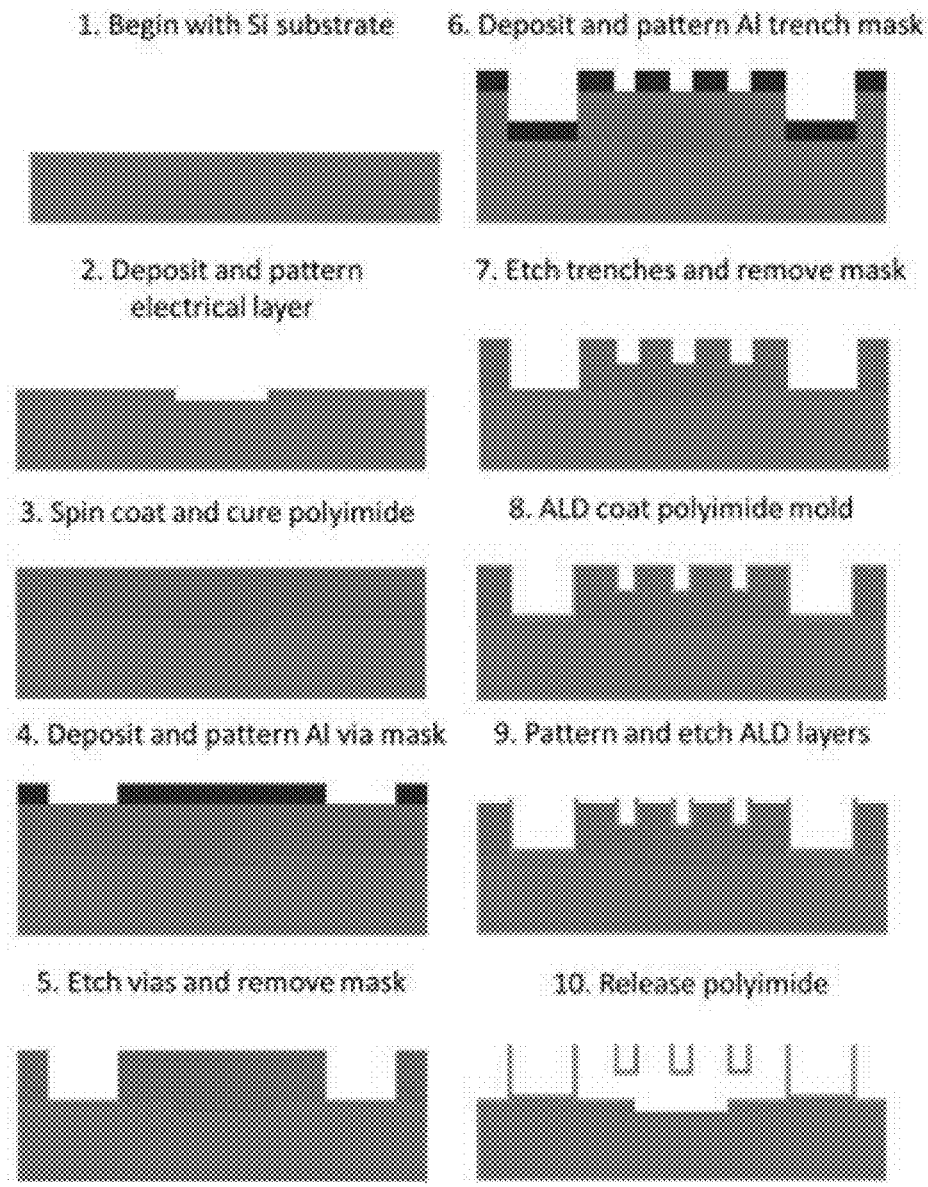
FIG. 1A is a non-limiting illustration of the process for forming a microdevice and/or nanodevice.

The present invention relates to novel nano- and microelectromechanical devices and novel methods of preparing them. The invention includes methods of generating nanodevices. The invention further includes nanodevices generated according to methods of the invention.

As demonstrated herein, through low deposition temperatures and lack of high energy ion bombardment, ALD in combination with polymers allows for the production of devices without the problems associated with other deposition techniques. ALD material generation on organic polymers is a reliable, scalable, and high-performing method utilizing aluminum oxide ($Al_2O_3$) as a model material. The $Al_2O_3$ may be used as a seed layer for the growth of metal, semi-conducting and insulating layers including, but not limited to W, Ru, Pt, ZnO, $TiO_2$ and $SiO_2$. Polymers may be used as insulating layers, adhesion layers, thermal barrier layers, encapsulating bio-compatible gels, moldable substrates, flexible or stretchable substrates, and ALD materials as electrical, mechanical or optical layers for patterned Nano/Microelectromechanical Systems (N/MEMS). Additionally, ALD coatings on polymers offer advantageous conformal, continuous and pinhole-free coatings for applications in gas diffusion applications and microsystem packaging. Devices from the combination of ALD on polymers enable the continued trend of miniaturization, cost reduction and unique materials development and integration in an increasingly diverse semiconductor industry.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

As used herein, the term "ALD" refers to atomic layer deposition, which is a thin film deposition method. In certain embodiments, the term "thin" refers to a range of thickness from about 0.1 nm to about 300 nm. ALD uses a self-limiting reaction sequence that deposits films in discrete steps limited by surface site chemical reactions. It produces continuous films with atomically controlled thicknesses, high conformality, and typically pinhole-free and atomically smooth surfaces. These are essential properties as design constraints push device technologies to ever smaller sizes. In certain embodiments, molecular layer deposition (MLD) is a non-limiting example of ALD. In other embodiments, materials prepared using ALD include materials prepared using MLD. In yet other embodiments, MLD comprises depositing an alkoxide polymer on a substrate. In yet other embodiments, MLD comprises generating a polymer by alternating reactions of chemicals selected from a first and a second group; wherein the first group includes, but is not limited to, trimethyl aluminum, titanium tetrachloride, and diethyl zinc; and wherein the second group includes, but is not limited to, ethylene glycol, propylene glycol, glycerol, hydroquinone, 1,2-ethanedithiol, and 1,3-propanedithiol.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "μm" is the abbreviation for "micron" or "micrometer", and it is understood that 1 μm=0.001 mm=$10^{-6}$ m=1 millionth of a meter.

As used herein, the term "nanodevice" refers to a device that has at least one component with at least one spatial dimension less than 1 micron.

As used herein, the term "nm" is the abbreviation for "nanometer" and it is understood that 1 nm=1 nanometer=$10^{-9}$ m=1 billionth of a meter.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

Disclosure

The present invention relates to novel nano- and microelectromechanical devices and novel methods of preparing them. In one aspect, the invention includes methods of preparing a nanodevice.

In certain embodiments, the invention provides a repeatable and extendable top-down process for the fabrication of nanoscale- and/or microscale devices and structures. The process includes the etching of ALD generated ultra-thin films on polymer substrates with three-dimensional features to form the devices or structures. Because the process incorporates standard surface micromachining practices such as lithography, numerous two-dimensional patterns may be generated depending on the type of lithography employed. The process includes the capability to generate multilevel two- (or more)-story, suspended ALD structures with about 10 nm thickness. Some non-limiting structures that may be achieved include beams and plates that incorporate mechanical shaping through three-dimensional molds. More sophisticated structures may build on these initial structures as elements in a larger design. The curl of devices with varied thicknesses may be controlled by variation of the number of cycles and the temperature used for ALD. Certain embodiments of a structure fabricated with the invention include an absorption structure for an uncooled microbolometer infrared light sensing pixel, atomically tuned for flatness.

In certain embodiments, the process for preparing nanodevice(s) and/or microdevice(s) (N/MEMS) includes coating by ALD a patterned polymer layer with an ALD-generated layer; patterning the ALD-generated layer to form the nanodevice; and releasing the nanodevice from the patterned polymer layer. The process may additionally include, in various embodiments, providing a substrate; depositing an electrical layer on the substrate; patterning the electrical layer on the substrate; coating the electrical layer with a polymer layer; and patterning the polymer layer to provide the patterned polymer layer. In certain embodiments, one or more of the additional process steps are not mandatory to the overall process.

ALD processes are based on reaction sequences. In a typical binary ALD reaction sequence, precursor A reacts with surface sites of a given substrate until each surface site is occupied (self-limiting) and is then purged from the chamber. Then, precursor B reacts with the previous layer formed from precursor A until each surface site is occupied and then purged from the chamber. The final material after the A-B cycle is the targeted chemistry. The cycle is repeated to build up a desired film thickness in discrete atomic increments. For generation of $Al_2O_3$, precursor A may comprise trimethyl aluminum ($Al(CH_3)_3$), and precursor B may comprise water ($H_2O$). The deposition may occur in a chamber maintained at about 1 Torr of pressure during depositions and a temperature from about 100° C. to about 300° C. Depositions may include, but are not limited to, the following layer stacks: $Al_2O_3/W/Al_2O_3$ and $Al_2O_3/Ru/Al_2O_3$. $Al_2O_3/W/Al_2O_3$ ALD was performed at 130° C. in a custom built reaction chamber. $Al_2O_3/Ru/Al_2O_3$ ALD was performed in a Beneq TFS 200 commercial reactor at 300° C. Trimethylaluminum (TMA) and $H_2O$ may be used for the deposition of $Al_2O_3$ for precursor growth at about 0.11 nm/cycle. $Si_2H_6$ and $WF_6$ may be used for the deposition of W for precursor growth at about 0.384 nm/cycle. Thermally activated $Ru(EtCp)_2$ and $O_2$ may be used for the deposition of Ru at about 110° C. for growth at about 0.04 nm/cycle.

The invention includes a materials integration method for integrated circuit (IC) compatible surface micromachining. The invention includes methods of fabricating devices including, but not limited to, suspended N/MEMS with thicknesses controlled to angstrom precision; multiple levels of mechanical, electrical, or optical structures with three-dimensional features with atomically controlled residual stress; hybrid inorganic on organic structures; flexible devices with ultra-thin active ALD materials; and ultra-thin biocompatible encapsulated structures.

ALD-generated films may be electrically conducting, semi-conducting or insulating layers for microscale and nanoscale devices, mechanical supporting layers in suspended devices (e.g., thermally isolated devices, microresonators, micro-actuators); electromagnetic sensing or interference layers in suspended and non-suspended devices; high performance atomically controlled gratings for transmission, reflection or absorption in a large range of electromagnetic spectrums; optical waveguides; and suspended absorbance structures for electromagnetic sensing.

FIG. 1A provides a non-limiting illustration of a process for preparing a nanodevice and/or microdevice according to the present application. As illustrated, ALD was used to grow laminate films on a polymer mold with exposed electrical interconnect layers. The polyimide mold included vias and trenches, which were then conformally coated by an ALD laminate. The laminate may have a metal layer surrounded by two dielectric layers. In FIG. 1A, the metal layer was illustrated as W or Ru, the dielectric was illustrated as $Al_2O_3$, and the polymer was illustrated as a polyimide. A bottom layer of the dielectric coated the polyimide and promoted nucleation of the metal layer, and the top layer of the dielectric protected against oxidation of the metal layer or balanced stress gradients to promote flatness in the final structure. Without wishing to be limited by any theory, the dielectric was present between the ALD metal and the electrode, and it was thin enough that an electrical connection was readily achieved through the dielectric.

In certain embodiments, devices may be fabricated by, but are not limited to, the steps outlined in FIG. 1A, which utilizes polyimide as the polymer in combination with ALD materials. In certain embodiments, an aluminum electrical interconnect film is evaporated and lift-off patterned on a silicon wafer substrate. In other embodiments, a spacing and sacrificial layer of polyimide is spin-cast and cured to a thickness defined by the desired device design. In yet other embodiments, the polyimide is masked for an $O_2$-reactive ion etching of vias and repeated for the etching of patterned trenches. In yet other embodiments, the trenches are not etched through to the underlying Al layer and provide an increased structural rigidity mold for the final suspended device. In yet other embodiments, $Al_2O_3$ is nucleated and conformally grown using ALD onto the underlying polyimide mold. In yet other embodiments, an ALD metal is nucleated on the ALD $Al_2O_3$ as an active electrical, mechanical, thermal or optical layer. In yet other embodiments, ALD materials may be deposited depending on the device's targeted application. In yet other embodiments, another layer of ALD $Al_2O_3$ may be deposited as an oxidation protection layer, or another ALD metal for a targeted optical, mechanical, or thermal function. In yet other embodiments, the ALD-generated layers are patterned and etched into lateral designs depending on the device's targeted application and desired release structure shape. The ALD deposited material is the exact same thickness on the via sidewalls, the trench floor and sidewalls, and on the top of the face of the polyimide. The ALD material thickness varies slightly by several angstroms on the exposed electrical layer compared to that on the polyimide. Without wishing to be limited by any theory, this occurs because of the varied nucleation rates of the ALD $Al_2O_3$ on different materials. In yet other embodiments, the polyimide is released by an isotropic $O_2$ ashing step, leaving the suspended ALD laminate structure. The ALD coating conformally coats the vias and trench sidewalls and floor to produce a three-dimensional self-supported structurally rigid ultra-thin structure.

In certain embodiments, an advantage of this fabrication process is extendibility. Additional spin-cast layers of polyimide or alternative polymer over the existing first level patterned ALD on polyimide laminate and subsequent steps may be repeated, wherein the vias of the second level polyimide are etched to either the substrate level or the first level ALD-generated layers. Then the release of the entire multilevel structure with an $O_2$ reactive ion etch (RIE) ash suspends a multi-level ALD structure.

Figure 1B:
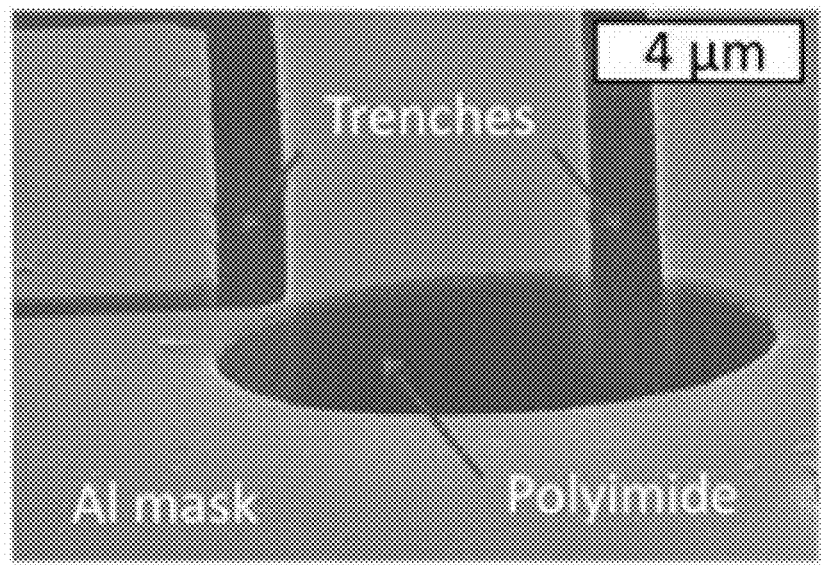
FIG. 1B is a non-limiting scanning electron microspcope (SEM) image of an etched polyimide mold of vias and trenches with an aluminum mask.
Figure 1C:
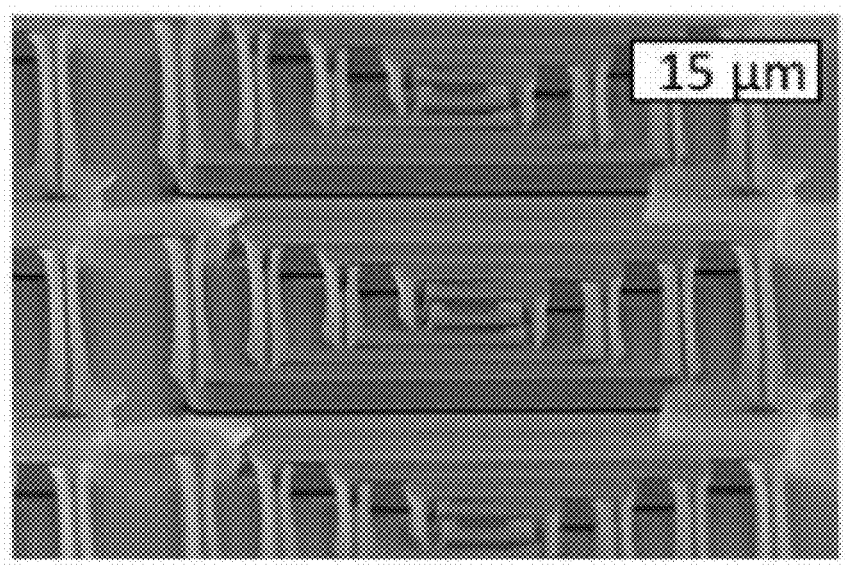
FIG. 1C is a non-limiting SEM image of partially released structures.
Figure 1D:
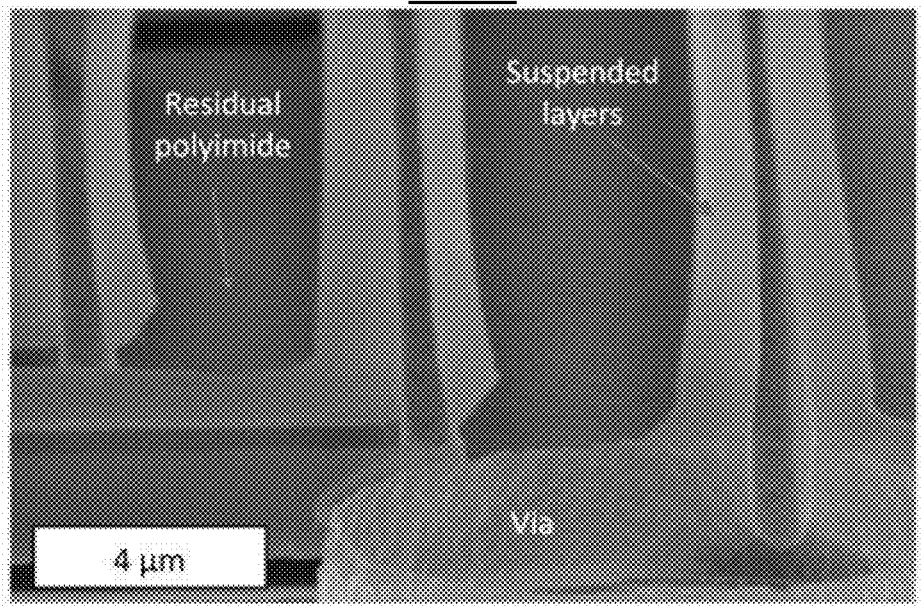
FIG. 1D is a non-limiting magnification of the image in FIG. 1C.

By way of further explanation, FIG. 1B is an etched polyimide mold of vias and trenches with aluminum mask. The via is nominally 3 μm deep and exposes the underlying metal layer and connected to a 1.5 μm deep trench pattern. FIG. 1C is an image of partially released structures of 2.2 nm $Al_2O_3/18$ nm W/2.2 nm $Al_2O_3$. The thin bottom $Al_2O_3$ layer allows an electrical connection from the substrate to the tungsten layer. The ALD-generated layers conformally coat the via and trench mold illustrated in FIG. 1B. FIG. 1D is a magnified view of the structures illustrated in FIG. 1C. All FIG. 1 images were taken at a 75° angle.

Figure 3A:
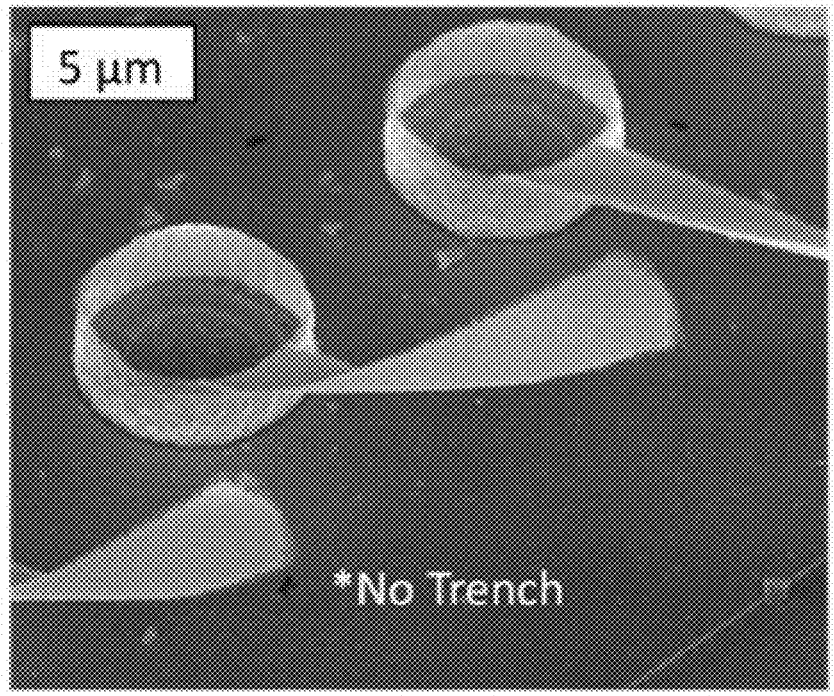
FIG. 3A is a non-limiting SEM image of a fixed-free cantilever.
Figure 3B:
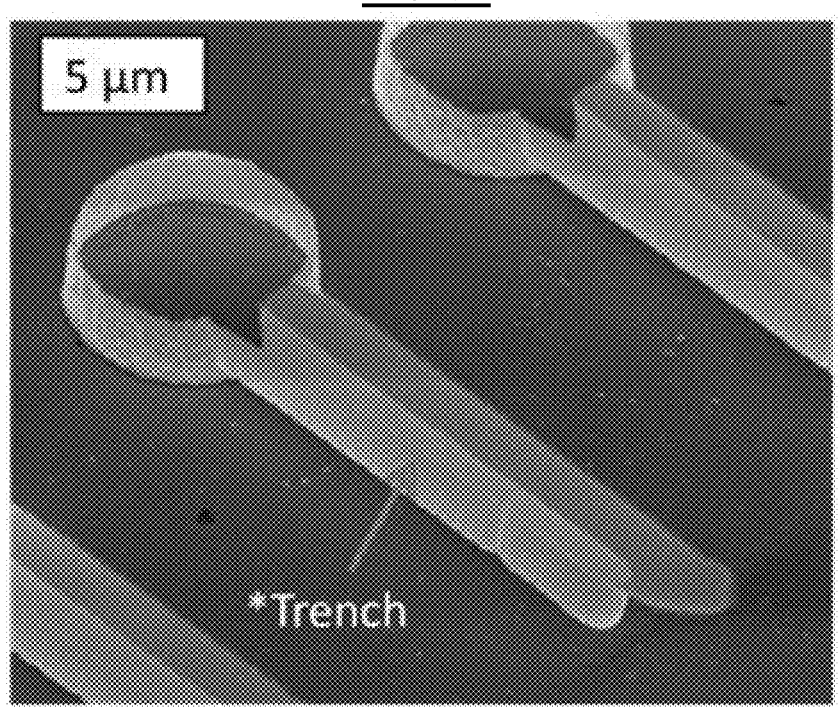
FIG. 3B is a non-limiting SEM image of a fixed-free cantilever with the same dimensions as the one of FIG. 3A, but with a trench included to maintain mechanical flatness.

By utilizing an ultra-smooth polyimide mold, the vias and trench are very smooth, provided that the etching process does not add roughness. The smooth mold as illustrated in FIG. 5 results in a smooth suspended structure as illustrated in FIG. 3A and FIG. 3B. The smooth mold allows the ALD to form a very conformal surface and a coating texture of atomic precision.

Figure 2A:
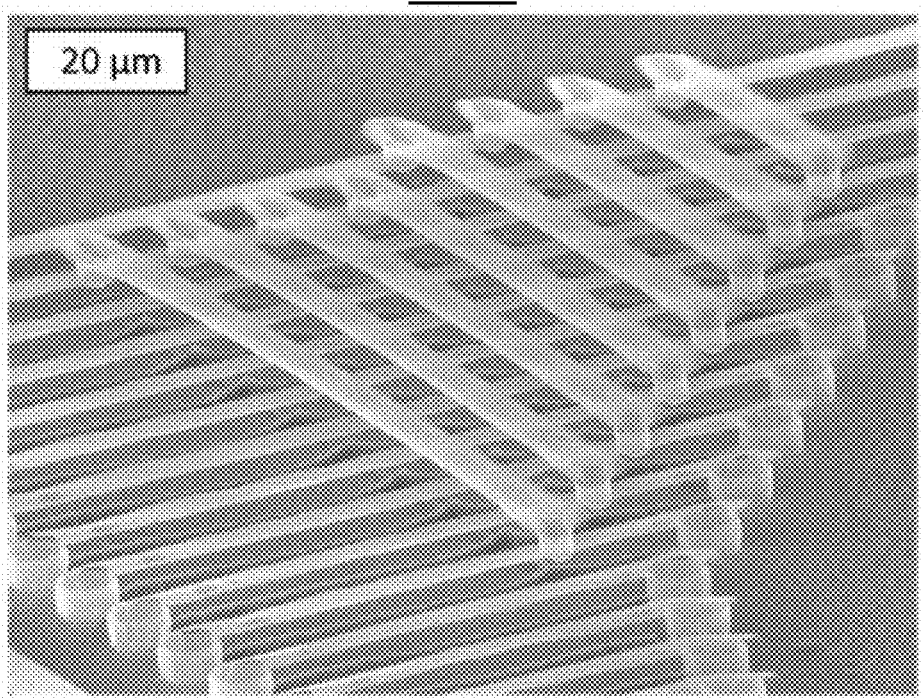
FIG. 2A is a non-limiting SEM image of a released two-story suspended fixed-fixed cantilever structure.

Utilizing an extended process of FIG. 1A, two-level suspended structures with a 13.5 nm thickness laminate of $Al_2O_3/Ru/Al_2O_2$ are illustrated in FIG. 2A. The process is extendable to any number of levels, as long as the final structure is designed to be mechanically robust and self-supporting. These ALD laminates produce very robust structures. For example, in FIG. 2A, the first level fixed-fixed cantilevers have length to thickness aspect ratios of $10^4$ and remain very flat, while supporting multiple anchors from second level cantilevers. The two-story suspended fixed-fixed cantilever structures in FIG. 2A include 5.5 nm $Al_2O_3$/ 2.5 nm Ru/5.5 nm $Al_2O_3$ fabricated from the extended process. The second level vias are etched to the underlying first level patterned nanostructures and the process repeated.

Figure 2B:
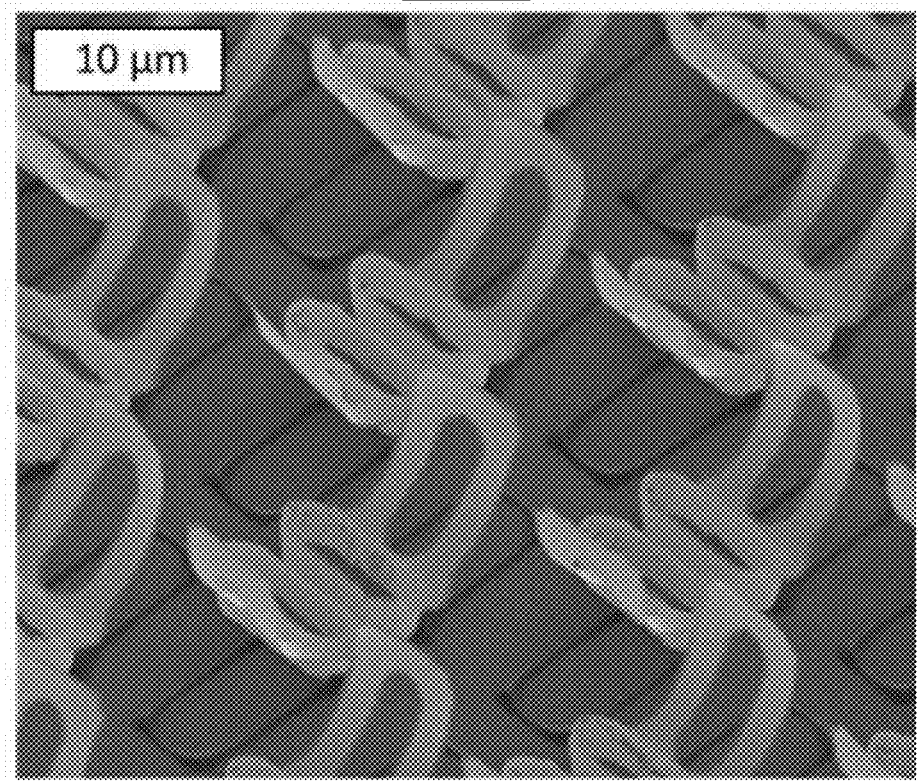
FIG. 2B is a non-limiting SEM image of an array of metamaterial-like structures.
Figure 2C:
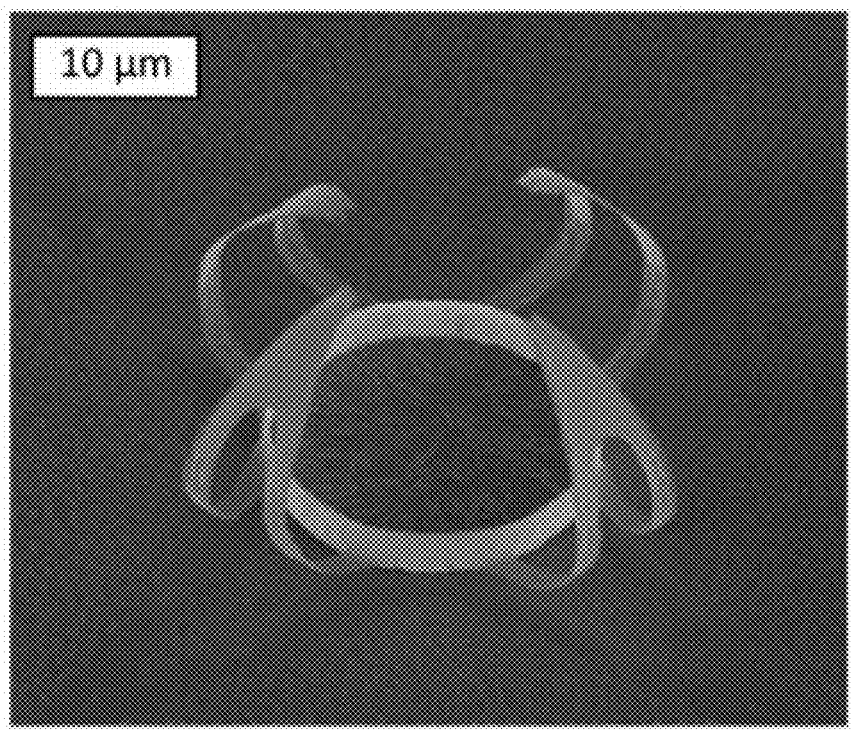
FIG. 2C is a non-limiting SEM image of a curled structure.
Figure 2D:
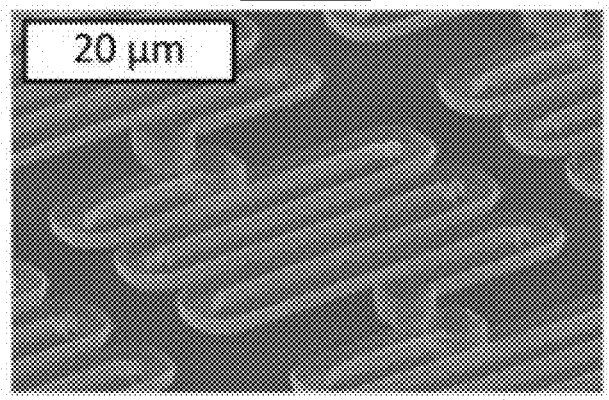
FIG. 2D is a non-limiting illustration of a microbolometer-like structure having a trench.
Figure 2E:
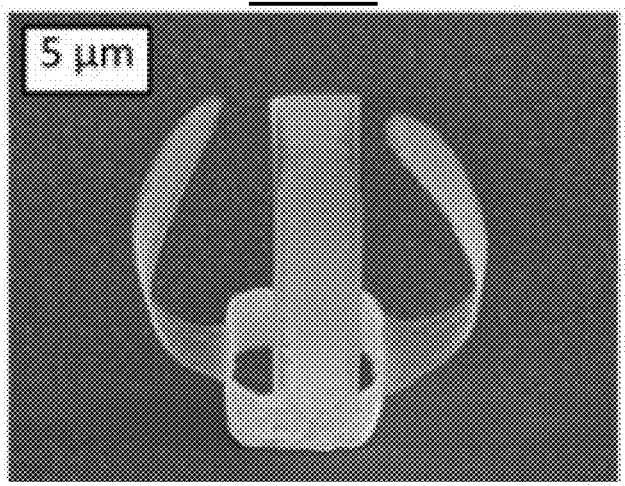
FIG. 2E is a non-limiting SEM image of a curled structure.
Figure 2F:
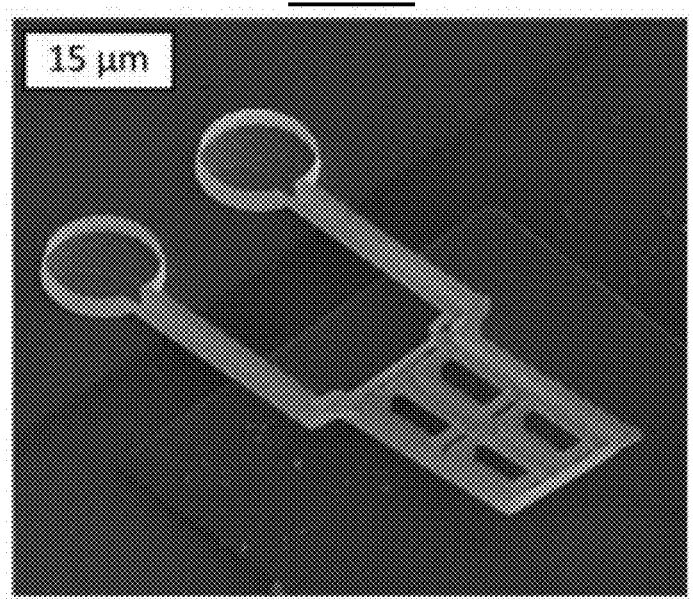
FIG. 2F is a non-limiting SEM image of a micromechanical paddle structure.

By utilizing standard lithography methods in this process, fabrication of any pattern that can be achieved with micro or nanolithography is possible. A variety of patterns with suspended ALD laminates with W and Ru surrounded by $Al_2O_3$ are illustrated in FIG. 2. FIG. 2B demonstrates an array of $Al_2O_3$/W/$Al_2O_3$ structures curled upwards relevant to the development of three dimensional metamaterials. The structure is 5.5 nm $Al_2O_3$/18 nm W/5.5 nm $Al_2O_3$. FIGS. 2C and 2E demonstrate flower petal patterns for potential applications such as nanotrapping systems for single cell biological testing platforms. Flat structures are also achievable through stress balancing or additional mechanical support (FIGS. 2D and 2F). In FIG. 2D a 5.5 nm $Al_2O_3$/5 nm Ru/7.7 nm $Al_2O_3$ microbolometer-like structure with a trench is shown. In FIG. 2E a 5.5 nm $Al_2O_3$/5 nm Ru/7.7 nm $Al_2O_3$ curled structure is shown. In FIG. 2F, a 2.2 nm $Al_2O_3$/18 nm W/2.2 nm $Al_2O_3$ micromechanical paddle structure is shown. For FIGS. 2A and 2D, the images were taken at a 60° angle, and for FIGS. 2B, 2C, 2E and 2F were taken at a 45° angle.

Figure 3C:
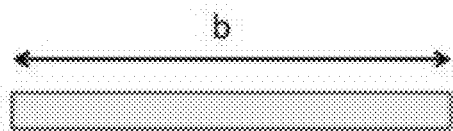
FIG. 3C is a non-limiting illustration of beam cross-section for flat and trench structures.
Figure 3C:
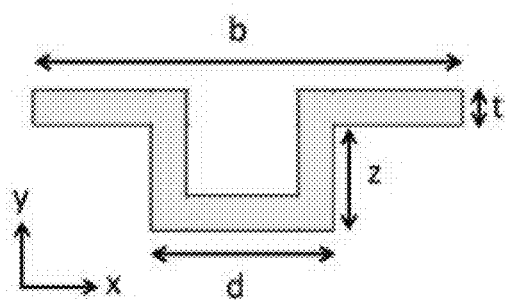

N/MEMS devices continually face mechanical issues surrounding residual stress effects from both intrinsic film stress and fabrication conditions. To suspend flat or specifically curled structures, control over the properties of these active thin films is important. Herein control of mechanical properties was demonstrated by incorporating a three-dimensional mold in the sacrificial polyimide layer. FIGS. 3A-3C demonstrate the effect of a trench in structural reinforcement of fixed-free cantilevers. Without the trench, the large bi-axial stress curls the cantilevers (FIG. 3A). With the addition of the trench in the cross section (FIG. 3B), the device stiffness was substantially increased. For a flat beam with thickness t, width b, and effective Young's modulus $E_{\it eff}$, the flexural rigidity EI about the x-axis is given as:

$$EI_{flat} = E_{\it eff} b t^3 / 12 \quad (1)$$

For a channel section with depth z, and width d (FIG. 3C), the y-axis centroid coordinate $C_y$, area A, and flexural rigidity about the x-axis of the full trench structure from the bottom of FIG. 3C $EI_{trench}$, are given as:

$$C_y = \frac{2z^2 t + (d-t)t^2}{2zd - 2(d-t)(z-t)} \quad (2)$$

$$A = 2tz + (d-t)t \quad (3)$$

$$EI_{trench} = E_{\it eff}\left[\frac{1}{12}(b-(d-t))t^3 + \frac{1}{3}((d-t)t^3 + 2tz^3) - AC_y^2\right] \quad (4)$$

The first term in the brackets of $EI_{trench}$ accounts for the moment of inertia of the flat overhang sections of the trench and the rest for the moment of inertia for the channel section of the trench.

Figure 3D:
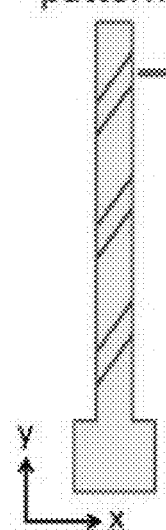
FIG. 3D is a non-limiting illustration of an alternative trench design for targeted stress relief control.
Figure 3E:
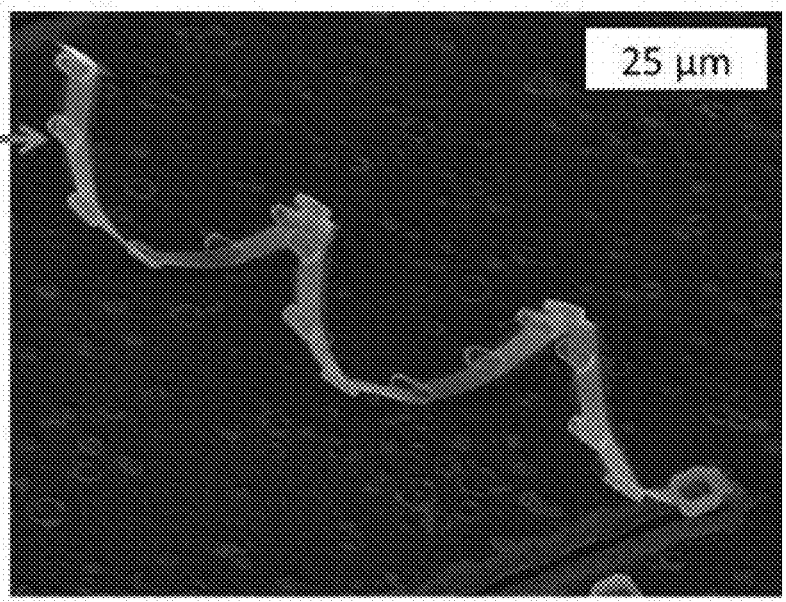
FIG. 3E is a non-limiting SEM image of a helical structure.
Figure 3F:
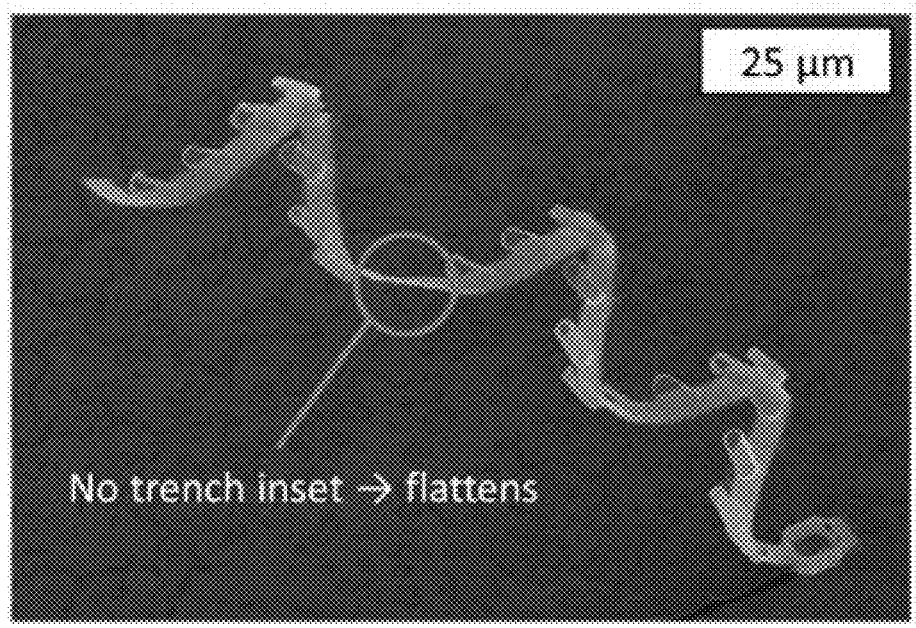
FIG. 3F is a non-limiting illustration of a helical structure with missing trench demonstrating the flattening control of the cantilever structure.

In a non-limiting example, the flexural rigidity of the trench inset beam from FIG. 1B for a stress free structure with d of about 1.5 µm and z of about 1.6 µm, is about $10^4$ times larger than the flat beam in FIG. 1A with the same width, thickness and effective Young's modulus. This trench method may be used to ensure mechanical flatness when other optical, thermal or electrical performance constraints require film thicknesses, or material combinations that would produce curled release structures without the trench. Additionally, the trench process may be used to induce targeted physical shapes such as three-dimensional helices as depicted in FIG. 3E. Trench insets placed in angled increments along the cantilever structures (FIG. 3D) force the structure to spiral upon release (FIGS. 3E-3F).

FIG. 3A illustrates a 2.2 nm $Al_2O_3$/18 nm W/2.2 nm $Al_2O_3$ fixed-free cantilever. FIG. 3B is an image of a fixed-free cantilever with the same dimensions as FIG. 3A, but with a trench included to maintain mechanical flatness. FIG. 3C is an illustration of beam cross-sections for flat and trench structures. FIG. 3D is an example of alternative trench designs for targeted stress relief control in FIGS. 3E-3F. FIG. 3E is a 5.5 nm $Al_2O_3$/5 nm Ru/7.7 nm $Al_2O_3$ helical structure based on the design from the structure illustrated in FIG. 3D. FIG. 3F is an image of a helical structure without a trench, demonstrating flattening control of cantilever structure where inset is missing. All images presented in FIGS. 3A, 3B, 3E, and 3F were taken at 45° angle.

Figure 4A:
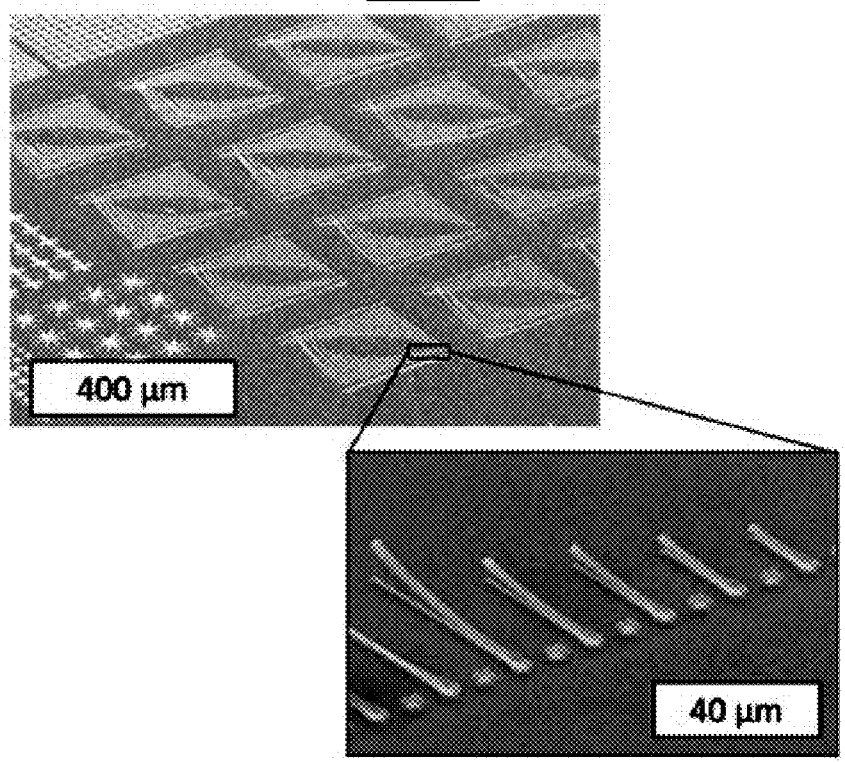
FIG. 4A is a non-limiting SEM image of suspended $Al_2O_3/Ru/Al_2O_3$ fixed-free cantilever arrays for curl measurements.
Figure 4B:
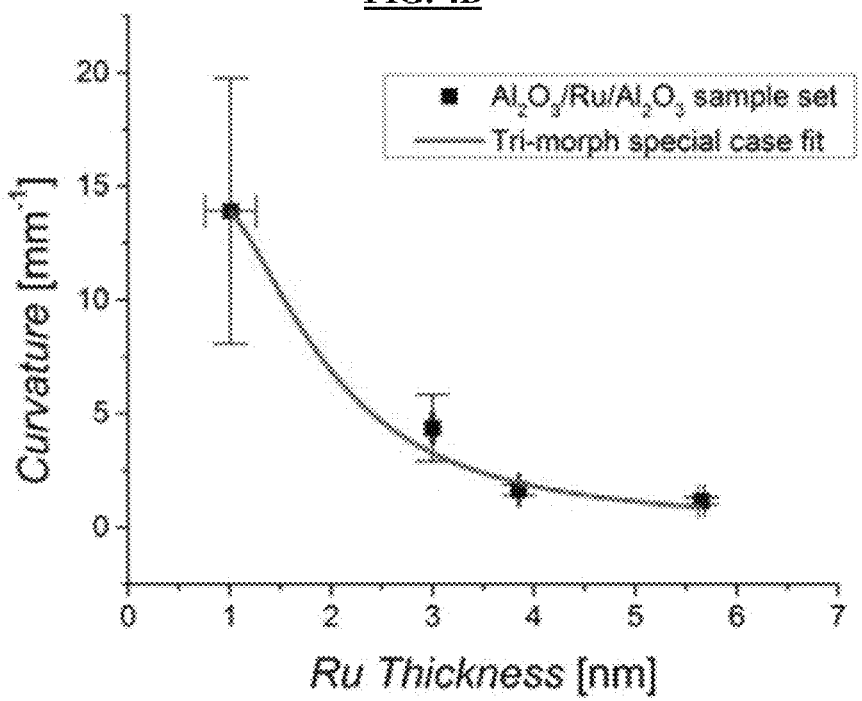
FIG. 4B is a non-limiting graph of curvature as a function of thickness of ruthenium.

FIG. 4A illustrates the suspension of laminate fixed-free cantilevers of varying length. Four chips underwent identical processing conditions, but with varied Ru thicknesses from about 1.5 nm to about 5 nm and outer $Al_2O_3$ layers with about 5.5 nm thicknesses. To reduce anchor influence, the fabrication process outlined in FIG. 1A was modified by excluding the vias and trenches to release the ALD structures anchored directly to the polyimide. The cantilever curl magnitudes from suspended arrays on each chip were then measured. FIG. 4B is a graph of the relation between curl and Ru thickness. With atomically controlled ALD material thicknesses, a desired curl level, i.e. high curl for a self-assembled structure, or no curl for a traditional MEMS device structure, may be obtained by atomically tuning material thicknesses.

The methods of the invention may be used to form any of the nanodevices and/or microdevices described herein. Such nanodevices and/or microdevices may be three-dimensional devices having a single or multiple ALD-generated layers. The nanodevices and/or microdevices may include a bolometer (such as, but not limited to, a spiral bolometer), a transducer, a temperature sensor, a thermistor, a microbolometer, an acoustic transducer, a microphone, a speaker, an ultrasonic transducer, a resistor, an inductor, a spiral inductor, a flagellum (such as, but not limited to, a biomimetic flagellum), a flagellum motor, a freestanding nanodevice, a freestanding microdevice, a Bragg reflector, a Bragg filter, an antenna, a terahertz detector, an electromagnetic transformer, or an electrical system. The nanodevices and/or microdevices may have a heat capacity less than about 200 pJ/K. This includes nanodevices and/or microdevices having a heat capacity less than about 100 pJ/K. The nanodevices and/or microdevices may have a mass less than about 0.2 ng. This includes nanodevices and/or microdevices having a mass less than about 0.1 ng.

One type of illustrative device that may be formed by the methods of the invention is a microbolometer for infrared imaging. Such devices benefit from low thermal mass, increasing their speed of response to absorbed infrared radiation. Commonly, thin resistive metal layers provide optimal absorption properties at thickness smaller than 25 nm, but require thick protective dielectric layers. The absorption structures must be extremely flat to ensure maximum absorption and fill-factor in a fabricated array.

A microbolometer pixel structure must perform several functions: these functions include absorbing infrared radiation, maintaining thermal isolation, and transducing temperature to electrical resistance. The transducing function is performed by a resistive element within which changes in temperature, caused by thermal energy transfer from absorbed radiation by the absorber, result in changes of the transducer's resistance. In order to maximize this effect, the absorber should be designed to absorb as much incident infrared radiation as possible. This is achieved by material choices, thickness of those materials, and mechanical design of the microbolometer. First, a reflective layer is often deposited at the substrate level to enable an optical absorbance cavity to maximize IR absorption in the absorber. Second, the thermal conduction out of the microbolometer is designed to reduce thermal loss. The second requirement is often achieved by suspending the structure from the underlying substrate by thin, thermally resistive support legs.

In certain embodiments, the process for producing a microbolometer includes at least one of the following steps: providing a silicon wafer; depositing and patterning a reflective metal and electrical interconnect; spinning sacrificial polyimide to a desired height to effect optical cavity resonance; patterning the polyimide with reactive ion etching $O_2$ plasma to form a three-dimensional mold for subsequent ALD-generated layers; depositing and patterning an ALD-generated multilayer consisting an initial $Al_2O_3$ seed layer for an optically active metal layer and a final protective $Al_2O_3$ layer; and releasing the polyimide with isotropic $O_2$ plasma etch to suspend a three-dimensional ultra-thin ALD pixel structure. Optionally, the method also includes, prior to releasing, spinning a second level sacrificial polyimide to a desired height optical performance, patterning the polyimide with reactive ion etching $O_2$ plasma to form a three-dimensional mold for subsequent ALD-generated layers; and depositing and patterning an ALD-generated multilayer on an $Al_2O_3$ seed layer for an optically active metal layer and a final protective $Al_2O_3$ layer. The releasing of the polyimide would then follow.

Figure 8:
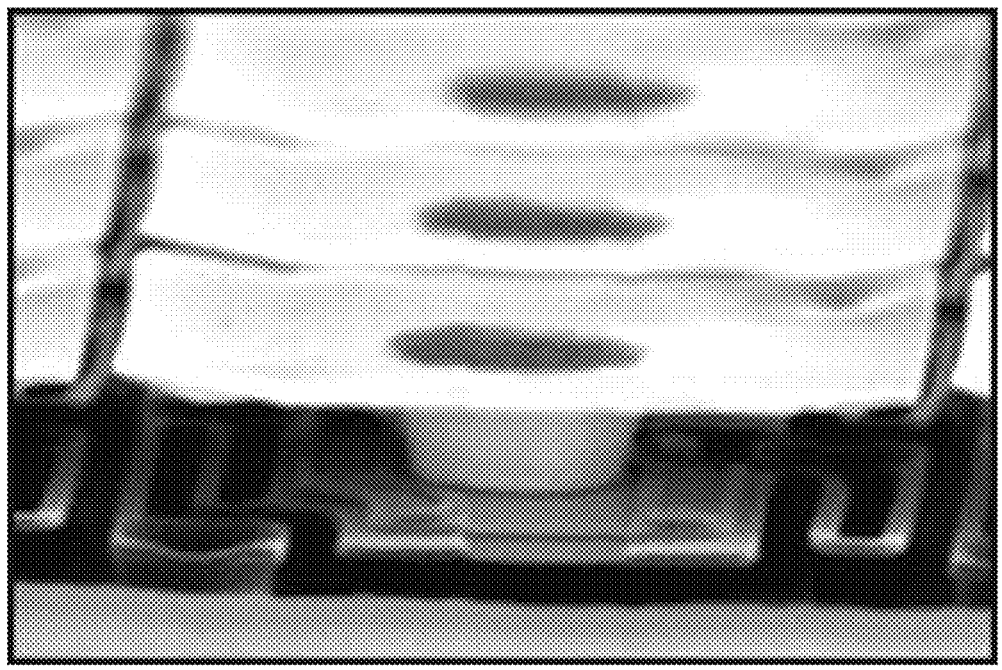
FIG. 8 is a non-limiting SEM image of a bolometer from DRS.

In some embodiments, the microbolometer has a radiation absorbing device that is less than 100 angstroms thick. In certain non-limiting examples, radiation absorbing device for a microbolometer includes an umbrella-like structure comprised of atomic layer deposited materials. This structure is spaced apart, but anchored to an underlying transducer, which is spaced apart, but anchored to the underlying read-out integrated circuit (ROIC). The radiation absorbing structure contains support and protection layers, which are thinner than the resistive metal absorber to reduce the overall thermal mass resulting in a faster speed of response for the bolometer in comparison to conventionally produced bolometers. One non-limiting embodiment of the structure described herein is a bolometer from DRS (FIG. 8). The upper-level structure is a radiation absorbing structure that is mechanically and thermally connected to an underlying transducer comprising vanadium oxide ($VO_x$). The transducer may be mechanically and thermally connected to thin support legs that are mechanically, electrically, and thermally connected to an underlying electrical layer and read-out integrated circuit (ROIC). As infrared radiation is absorbed by the absorber, heat is generated and dissipated into the transducer and out through the support legs to the substrate. The transducer is designed to change its electrical resistance with temperature. By running an electrical current from the ROIC through one side of the support leg, across the transducer and through the opposite side support leg, the electrical resistance may be monitored as temperature changes are induced by absorbed radiation.

The use of the ALD in combination with polymers enables this high-performance microbolometer. The device is fabricated by directly utilizing the extended fabrication process as disclosed herein (FIG. 1) to build a two-level suspended device (FIG. 2). Assuming the first level support and transducer layers are fabricated from a combination of polyimide and non-ALD thin film deposition techniques (i.e., $VO_x$ layer), the second level is fabricated utilizing ALD-generated materials in combination with a polyimide solid supporting material layer. The second level polyimide layer is spun cast to a targeted thickness for optical performance, upon which an ALD-generated layer is grown to seed a resistive ALD-generated IR absorption layer and subsequent ALD-generated protection layer. Utilizing all ALD-generated materials streamlines the deposition process resulting in a low-stress, self-supported radiation absorbing structure. The ALD-generated layers are then patterned and etched into a lateral design based on the pixel's mechanical, thermal and optical design requirements. The ALD-generated support and protection layer thicknesses are thinner than the resistive ALD-generated IR absorption layer and less than 80 angstroms in total thickness. The result is a substantial reduction in the total thermal mass of the pixel. This reduction in thermal mass, through bolometer design, can result in an increased speed of response for the device, maximum absorption in the resistive ALD-generated absorber layer and/or increased sensitivity of the device.

A bolometer with ALD-generated materials included as structural, optical or thermal materials may have a lower thermal time constant. For example, a standard thin film 30 Hz imaging device may have a time constant of about 10 ms and an ALD enabled device may have a time constant of about 0.1 ms. Additionally, in a bolometer, a radiation absorbing structure or a support structure containing metal with sheet resistance less than 150 ohms/square may be formed. Other measures include a bolometer radiation absorbing structure laminate dielectric-metal-dielectric with an anchor to perimeter deflection of less than about 250 nm. This also includes an anchor to perimeter deflection of less than about 100 nm.

Another bolometer may have a spiral or serpentine structure wherein the support structures perform both the absorber and transducing functions and make up the entirety of the structure. Such a structure may have a support structure length to pixel pitch ratio greater than about 4:1 and up to about 350:1.

The bolometers may be of different types. The bolometers may include a DRS-style radiation absorbtion structure with ALD-generated layers, a DRS-style support structure with ALD layers, or a DRS-style combination structure with $VO_x$ transducer with ALD-generated layers in support structures and/or radiation absorbing structures.

In addition to the use of the structures formed by the disclosed methods as microbolometers, other uses include ultra-thin high sensitivity and high speed of response infrared sensors, low-power ALD MEMS actuators in a flexible package, ultra-thin flexible circuitry with active ALD-generated layers and double sided polyimide insulating barriers, flexible meta-materials formed by ALD-generated super-laminates, ultra-thin polyimide encapsulated bio-implantable sensors, and as hybrid suspended polymer and ALD-generated structures with low-modulus and thermal expansion. Such devices may further find utility in industrial, military, and commercial applications, including, but not limited to: monitoring of facilities and machinery; aerial surveillance; night vision; automotive collision avoidance; weapon detection; non-invasive medical imaging; water resource management; energy audits, petroleum and chemical safety monitoring.

Other uses include, but are not limited to, an electrical system on polymer; an insulated circuit and transducer; an electrical system encapsulated in polymer; an insulated circuit and transducer for bio-compatibility; an electrical system on stretchable polymer; an electrical system on flexible polymer; an electrical system on biocompatible material or biopolymer; an ALD-generated serpentine resistors; an acoustic transducer; a microphone; a speaker; an ultrasonic transducer; an ALD-generated spiral inductor; an ALD-generated flagellum; an ALD-generated biomimetic flagellum, freestanding transducers (with dimensions less than 1 µm) made using ALD and polymers or other suspended ALD or molecular layer depositions (MLD) processes; a Bragg reflector made with ALD on polymers for UV, THz or IR applications; a Bragg filter utilizing actuation of freestanding ALD Bragg reflector super laminate membrane; an antenna structure including photonic systems, arrays and metamaterials made using an ALD on polymer process; or freestanding nanodevices and/or microdevices made using any of the processes described herein or incorporating any of the methods or systems described herein.

Methods

In one aspect, the invention provides a method of preparing a nanodevice.

In certain embodiments, the method includes coating at least a portion of a solid supporting material layer with a first at least one thin solid material layer using atomic layer deposition (ALD), thus forming an ALD-generated layer. In other embodiments, the method includes patterning and/or etching the first at least one thin solid material layer, thus forming a nanodevice. In yet other embodiments, the method includes releasing at least a portion of the nanodevice from the one or more solid supporting material layers. In yet other embodiments, the solid supporting material comprises a polymer. In yet other embodiments, the solid supporting material layer comprises a patterned polymer layer. In yet other embodiments, the solid supporting material layer is patterned. In yet other embodiments, the method further comprises patterning the solid supporting material layer.

In certain embodiments, the method includes coating at least a portion of a polymer layer with a first at least one thin solid material layer using atomic layer deposition (ALD), thus forming an ALD-generated layer. In other embodiments, the method includes patterning the first at least one thin solid material layer, thus forming a nanodevice. In yet other embodiments, the method includes releasing at least a portion of the nanodevice from the one or more polymer layers. In other embodiments, the polymer layer comprises a patterned polymer layer. In yet other embodiments, the polymer layer is patterned. In yet other embodiments, the method further comprises patterning the polymer layer.

In certain embodiments, the method comprises coating by atomic layer deposition (ALD) a solid supporting material layer with an ALD-generated layer; patterning (e.g., etching) the ALD-generated layer to form the nanodevice; and releasing the nanodevice by partial etching of the solid supporting material layer, leaving it anchored to an underlying substrate by the remaining solid supporting material layer. In this case, the solid supporting material layer may be a material such as a polymer, etched with an oxygen plasma, or it may be a metal such as copper or nickel, etched with a fluorine-based plasma, or it may be any other solid material on which ALD may be performed.

In certain embodiments, the method of the invention comprises at least one (or all) of the following steps: providing a substrate; depositing an electrically conducting layer on the substrate; patterning the electrically conducting layer on the substrate; coating the electrically conducting layer with a polymer layer; patterning the polymer layer to provide the patterned polymer layer; depositing a non-ALD generated layer on the patterned polymer layer; and/or patterning the non-ALD generated layer on the patterned polymer layer.

In certain embodiments, prior to the releasing the nanodevice from at least a portion of the solid supporting material layer, the method further comprises at least one (or all) of the following steps: adding at least one additional solid supporting material layer to the nanodevice, thus forming at least one second-level solid supporting material layer; optionally patterning the at least one additional solid supporting material layer to create vias, trenches or other three-dimensional templates; coating the at least one additional patterned solid supporting material layer using ALD, thus forming at least one additional ALD-generated layer of thin solid material; patterning the at least one additional thin solid material layer, thus forming the nanodevice. In other embodiments, the method further comprises releasing the nanodevice from at least a portion of the first and/or additional patterned solid supporting material layer(s).

In certain embodiments, the sequence of addition of an additional solid supporting material layer, optional patterning of the solid supporting material, coating by ALD, and/or patterning are repeated one or more times prior to the release of the nanodevice from the patterned solid supporting material layers. In other embodiments, the release of the nanodevice comprises removing at least a portion of the first or additional solid supporting material layer(s). In yet other embodiments, removal of at least a portion of first or additional solid supporting material layer(s) is achieved using dry etching, including but not limited to the use of reactive ion etching and other plasma etching techniques, with polymer materials being removed for example by oxygen-based etches, and metal layers being removed for example by fluorine-based etchants such as $SF_6$.

In certain embodiments, the step of releasing the nanodevice from the solid supporting material layer(s) is omitted, thus providing a functioning nanodevice with the solid supporting material layer(s) remaining in place.

In certain embodiments, at least one selected from the group consisting of the first and additional solid supporting material layer(s) is deposited by evaporation. In other embodiments, at least one selected from the group consisting of the first and additional solid supporting material layer(s) is deposited by plasma enhanced chemical vapor evaporation. In yet other embodiments, at least one selected from the group consisting of the first and additional solid supporting material layer(s) is deposited on a solid material layer and the solid material layer is deposited by reactive ion beam deposition. In certain embodiments, the solid supporting material layer comprises $VO_x$.

In certain embodiments, at least one selected from the group consisting of the first and additional solid supporting material layer(s) comprises a biopolymer or biomaterial. In other embodiments, at least one selected from the group consisting of the first and additional solid supporting material layer(s) comprises at least one selected from the group consisting of a protein or polypeptide, carbohydrate, cellulose, chitin, and lignin. In yet other embodiments, the solid supporting material layer is flexible.

The polymer layer may include, but is not limited to, a polyimide, a polymethyldisiloxane, polystyrene (PS), epoxy, polypropylene (PP), poly(methyl methacrylate) (PMMA), polyethylene (PE), or poly(vinyl chloride) (PVC); polyesters such as polycaprolactone; proteins, polysaccharides and other biopolymers. In certain embodiments, the polymer layer includes a polyimide. The polymer layer (i.e. sacrificial polymer layer) may have a thickness of less than 10 µm when applied to the substrate. This includes thickness of less than 5 µm, less than 4 µm, less than 3 µm, or less than 2 µm.

In certain embodiments, the polymer layer or patterned polymer layer is the first or additional solid supporting material layer(s). In other embodiments, the substrate is a flexible material. In other embodiments, the substrate is a solid organic material. In yet other embodiments, the substrate is one or more of an epoxy, a polydimethylsiloxane (PDMS), a polyimide, a poly(methyl methacrylate), or a biopolymer such as a cellulose or a protein or other polypeptide.

The polymer substrate for subsequent ALD coatings provides several benefits. For example, the polymers may serve as an insulating layer. Such insulating layers have applications in electrical, mechanical, optical, devices and transducers by providing for low parasitic capacitance between ALD-generated layers and an underlying substrate. The polymer layer may function as a thermal insulation layer that protects active electronic or N/MEMS devices; an adhesion or encapsulating layer for packaging; an optical transmission or filtering layer; and as a sacrificial layer for generation of suspended electrical, mechanical and optical devices. Furthermore, polymers may be spun-deposited and cured to deliver precise thicknesses from 1 nm to several micrometers with good uniformity, and additional spin depositions may be performed in order to provide multi-layer suspended or non-suspended devices. A polymer layer may also serve, as a three-dimensional mold for highly conformal ALD coatings for suspended and non-suspended devices in complex geometries (anisotropic and isotropic inset molds etched via oxygen plasmas), as a flexible substrate upon delamination of an underlying support substrate that may be attachable as bio-surface sensors, as a bio-compatible substrate, and as an encapsulant for ingestion or implantation.

In certain embodiments, a polyimide is used as the polymer and as a substrate for ALD material devices. The polyimides offer the following benefits as materials used in fabrication: thermal resistance to high processing temperatures, ready nucleation of $Al_2O_3$ using ALD ($Al_2O_3$ may act as a seed layer for ALD of many other materials, e.g. metals used as active device layers), capability for spin deposition to a range of thicknesses from several nanometers to hundreds of microns, and easy dry etching in oxygen plasma (allowing formation of molds or sacrificial layer release of supported material layers formed by ALD). In certain embodiments, the polymer layer comprises a polyimide.

In certain embodiments, the polymer layer is less than 4 µm thick. In other embodiments, the patterned polymer comprises polymer vias and polymer trenches. In yet other embodiments, the polymer vias have a depth equal to the polymer thickness. In yet other embodiments, the polymer vias have a depth less than the polymer thickness. In yet other embodiments, the polymer vias expose underlying electrically conducting layer or a substrate layer. In yet other embodiments, the polymer trenches are connected to the polymer vias and the polymer trenches do not expose an underlying electrical or substrate layer. In yet other embodiments, the patterning of the polymer layer comprises reactive ion etching of the polymer layer with $O_2$ plasma.

In certain embodiments, the ALD is nucleated on both the exposed substrate or electrical layers and the polyimide mold simultaneously. ALD nucleation rates are substrate dependent, so a slight thickness difference between the ALD nucleated on the electrical layer and the ALD nucleated on the polyimide layer is possible. For example, ALD $Al_2O_3$ that nucleates on a polyimide layer may result in the formation of a very thin interfacial layer due to diffuse chemical interactions into the polyimide from the $Al_2O_3$ gas precursors. Once nucleated, the films are built as described elsewhere herein.

In certain embodiments, the ALD is performed at temperatures less than 450° C. In other embodiments, the ALD is performed at temperatures less than 200° C. In yet other embodiments, the atomic layer deposition is performed at a temperature of about 150° C. In yet other embodiments, the ALD is performed at a temperature of about 130° C.

In certain embodiments, at least one selected from the group consisting of the first and additional ALD-generated layer(s) comprises a metal, a metal oxide, a semimetal, a semiconductor, or a metal nitride. In other embodiments, at least one selected from the group consisting of the first and additional ALD-generated layer(s) independently comprises at least one selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, $RuO_2$, Si, SiC, SiGe, $SiO_2$, $SnO_2$, Ta, Ti, TiN, $TiO_2$, $V_2O_5$, $VO_x$, W, ZnO, and $ZrO_2$. In yet other embodiments, at least one selected from the group consisting of the first and additional ALD-generated layer(s) includes at least one material formed by molecular layer deposition (MLD).

The ALD-generated layer may include a single layer or a multi-layer structure. The ALD provides for control of the thickness of any layers deposited. For example, the ALD layers may have a thickness ranging from about 0.1 nm to about 300 nm, or about 1 nm to about 20 nm thick. For example, multilayer structures may include at least one dielectric layer and a metal layer. In certain embodiments, the dielectric layer includes $Al_2O_3$. In other embodiments, the metal layer includes at least one selected from the group consisting of Ru, W, Ag, Au, Fe, Os, Pt, Pd, Cu, Ir, and Rh. Where the ALD layers have a dielectric layer and a metal layer, the dielectric layer may be less than 10 nm thick, and the metal layer may be less than 25 nm thick.

Where the ALD layer includes at least two layers, each layer may individually be selected from Ru, W, Pt, $Al_2O_3$, $SiO_2$, ZnO, $TiO_2$, $HfO_2$, $ZrO_2$, $SnO_2$, and $V_2O_5$. The ALD layer may include multiple other layers such as a first, second, and third layer, where the second layer is located between the first and third layers. The ALD layer may include a first and a third layer of $Al_2O_3$, Pt and/or $SiO_2$, and a second layer of Ru, W, Mo and/or Ta, where the second layer being located between the first and third layers. The ALD layer may include a first layer of $Al_2O_3$, a second layer of W, and a third layer of Pt, where the second layer being located between the first and third layers.

In certain embodiments, the method further includes one or more of the following steps: providing a substrate; depositing an electrical layer on the substrate; patterning the electrical layer on the substrate; coating the electrical layer with a polymer layer; and patterning the polymer layer to provide the patterned polymer layer. In such embodiments, the polymer layer may include at least one selected from the group consisting of a polyimide, a polydimethylsiloxane, a polystyrene (PS), an epoxy, a polypropylene (PP), a poly (methyl methacrylate) (PMMA), an epoxy, a polyethylene (PE), and a poly(vinyl chloride) (PVC). The patterning of the polymer layer may include reactive ion etching of the polymer layer with an $O_2$ plasma.

In certain embodiments, the substrate includes at least one selected from the group consisting of Si, $SiO_2$, glass (such as but not limited to Pyrex), $Si_3N_4$, sapphire, GaAs, SiC and solid organic materials such as polymers. In other embodiments, the electrical layer comprises at least one selected from the group consisting of Al, Cu, Ti, Ni, Cr, Au, Pt, Ag, Ge, SiGe, SiC, TiN, Ta, indium tin oxide, $SnO_2$, ZnO, Si, and an organic conductor such as polypyrrole or polythiophene.

Devices

In certain embodiments, the nanodevice is a three-dimensional device. In yet other embodiments, the three-dimensional device has a via connected to an underlying electrical layer and the via is connected to a trench; wherein the trench is not connected to an underlying electrical layer or a substrate layer. In yet other embodiments, the three-dimensional device has added structural rigidity. In yet other embodiments, the three-dimensional device has a forced targeted shape. In yet other embodiments, the nanodevice is folded after the release step. In yet other embodiments, the nanodevice develops a three-dimensional structure after release due to buckling or other relaxation of residual stresses.

In certain embodiments, the nanodevice comprises multiple ALD-generated layers. In other embodiments, the multiple ALD-generated layers balance stress in the nanodevice. In yet other embodiments, the nanodevice comprises more than two ALD-generated layers in a three-dimensional array. In yet other embodiments, wherein the more than two ALD-generated layers, wherein the patterned polymer layer and a first additional patterned polymer layer are not released. In yet other embodiments, the patterned polymer layer and the first additional polymer layer insulate the ALD-generated layer. In yet other embodiments, the insulated ALD-generated layer forms an electrical system. In yet other embodiments, the patterned polymer layer and the first additional patterned polymer layer are not connected to the base substrate and form a self-contained stretchable system. In yet other embodiments, the patterned polymer layer and the first additional patterned polymer layer are not connected to the base substrate and form a self-contained bio-compatible system. In yet other embodiments, the second level patterned polymer exposes the first level ALD-generated layers. In yet other embodiments, the second level patterned polymer comprises polymer vias and polymer trenches. In yet other embodiments, the second level polymer trenches are connected to the second level polymer vias. In yet other embodiments, the second level polymer trenches do not expose the underlying first level ALD-generated layers, first level patterned polymer layer, first level electrical layer, or the substrate. In yet other embodiments, the second level ALD-generated layer is connected to the first level non-ALD-generated layers. In yet other embodiments, the second level ALD-generated layer is connected to the first level ALD layer. In yet other embodiments, a second level nanodevice comprises multiple ALD-generated layers in a three-dimensional array. In yet other embodiments, the second level nanodevice is connected to the electrical layer. In yet other embodiments, the second level nanodevice is connected to the substrate layer. In yet other embodiments, the second level nanodevice is connected the first level ALD-generated nanodevice. In yet other embodiments, the second level nanodevice is connected to separate first level ALD-generated nanodevices. In yet other embodiments, the second level nanodevice is connected to a non-ALD-generated layer in the first level nanodevice. In yet other embodiments, the second level nanodevice is connected to separate non-ALD-generated layers in separate first level nanodevices.

In certain embodiments, the nanodevice is a bolometer (such as, but not limited to, a spiral bolometer), a transducer, a temperature sensor, a thermistor, a resistor, an inductor, a flagellum (such as, but not limited to, a biomimetic flagellum), a flagellum motor, a freestanding nanodevice, a freestanding microdevice, a Bragg reflector, a Bragg filter, an antenna, a terahertz detector, an electromagnetic transformer, or an electrical system.

In certain embodiments, the nanodevice is a radiation absorbing device. In other embodiments, the radiation absorbing device absorbs electromagnetic radiation. In yet other embodiments, the radiation absorbing device absorbs electromagnetic radiation generated by black body emission. In yet other embodiments, the electromagnetic radiation is infrared light, visible light, microwaves, radio waves, terahertz radiation, ultraviolet light, or x-rays. In yet other embodiments, the infrared light is shortwave infrared light, medium wave infrared light, or long wave infrared light. In yet other embodiments, the electromagnetic radiation has a wavelength between 3 µm and 100 µm. In yet other embodiments, the electromagnetic radiation has a wavelength between 3 µm and 20 µm. In yet other embodiments, the electromagnetic radiation has a wavelength between 8 µm and 14 µm.

In certain embodiments, the nanodevice is a bolometer support structure. In other embodiments, the bolometer support structure comprises ALD-generated layers and is connected to a non-ALD-generated transducing layer. In yet other embodiments, the bolometer support structure comprises ALD-generated layers. In yet other embodiments, the bolometer support structure is connected to a non-ALD-generated transducing layer. In yet other embodiments, the radiation absorbing device connected to the non-ALD-generated transducer layer and connected to the support structure and an underlying read-out integrated circuit to form an entire bolometer device. In yet other embodiments, the nanodevice is a component in an array of devices that serve as a metamaterial. In yet other embodiments, the nanodevice interacts with electromagnetic radiation including but not limited to one of the following, infrared light, radio waves, microwaves, terahertz waves, ultraviolet light, visible light, x-rays, or gamma rays.

In certain embodiments, the interaction of the nanodevice with electromagnetic radiation may be one of the group of absorption, emission, reflection, diffraction, scattering, phase modification, or polarization modification. In other embodiments, the infrared light is shortwave infrared light, medium wave infrared light, or long wave infrared light. In yet other embodiments, the electromagnetic radiation has a wavelength between 3 µm and 100 µm. In yet other embodiments, the electromagnetic radiation has a wavelength between 3 µm and 20 µm. In yet other embodiments, the electromagnetic radiation has a wavelength between 8 µm and 14 µm.

In certain embodiments, the nanodevice has a heat capacity less than about 200 pJ/K. In other embodiments, the nanodevice has a heat capacity less than about 100 pJ/K. In yet other embodiments, the nanodevice has a mass less than about 0.2 ng. In yet other embodiments, the nanodevice has a mass less than about 0.1 ng. In yet other embodiments, the nanodevice has a total thickness less than about 35 nm. In yet other embodiments, the nanodevice comprises one or more ALD-generated layers. In yet other embodiments, the nanodevice comprises two or more ALD-generated layers.

In certain embodiments, the nanodevice has a dielectric-metal-dielectric composition. In other embodiments, the dielectric is $Al_2O_3$. In yet other embodiments, the $Al_2O_3$ layer and the polymer form an interfacial layer. In yet other embodiments, the interfacial layer between the solid supporting material and the ALD-generated material remains in the nanodevice after release. In yet other embodiments, the dielectric has a thickness of less than about 10 nm. In yet other embodiments, the dielectric has a thickness of less than about 5 nm. In yet other embodiments, the dielectric has a thickness of less than about 2 nm. In yet other embodiments, the metal has a thickness of less than about 25 nm. In yet other embodiments, the metal has a thickness of less than about 20 nm. In yet other embodiments, the metal has a thickness of less than about 10 nm. In yet other embodiments, the metal has a thickness of less than about 8 nm. In yet other embodiments, the metal has a thickness of less than about 5 nm. In yet other embodiments, the metal has a thickness of less than about 2 nm. In yet other embodiments, the metal has a sheet resistance of about 100 Ω/square. In yet other embodiments, the metal has a sheet resistance from about 25 Ω/square to about 1000 Ω/square. In yet other embodiments, the metal has a sheet resistance from about 70 Ω/square to about 500 Ω/square. In yet other embodiments, the metal has a sheet resistance from about 50 Ω/square to about 350 Ω/square. In yet other embodiments, the metal is W. In yet other embodiments, the W has a thickness from about 4 nm to about 20 nm. In yet other embodiments, the W has a sheet resistance from about 70 Ω/square to about 500 Ω/square. In yet other embodiments, the metal is Ru. In yet other embodiments, the Ru has a thickness from about 1 nm to about 10 nm. In yet other embodiments, the Ru has sheet resistance from about 25 Ω/square to about 1000 Ω/square. In yet other embodiments, the metal is Pt. In yet other embodiments, the Pt has a thickness from about 2 nm to about 8 nm. In yet other embodiments, the Pt has sheet resistance from about 50 Ω/square to about 350 Ω/square.

In certain embodiments, the nanodevice comprises ALD-generated $Al_2O_3$ and W connected with other non-ALD generated materials. In other embodiments, the insulating layer comprises $Al_2O_3$ and the conducting layer comprises Ru, W, or Pt.

In certain embodiments, the nanodevice has an anchor to perimeter vertical deflection of less than about 250 nm. In other embodiments, the nanodevice has an anchor to perimeter vertical deflection of less than about 100 nm. In yet other embodiments, the nanodevice has the exact same thickness along every three-dimensional face. In yet other embodiments, the nanodevice has about the same thickness along every three-dimensional face. In yet other embodiments, the metal ALD-generated layer/s have the exact same electrical resistivity along every three-dimensional face. In yet other embodiments, the metal ALD-generated layer/s have about the same electrical resistivity along every three-dimensional face. In yet other embodiments, the metal and the dielectric ALD-generated layer/s have the exact same thermal conductivity along every three-dimensional face. In yet other embodiments, the metal and the dielectric ALD-generated layer/s have about the same thermal conductivity along every three-dimensional face. In yet other embodiments, the ALD-generated layers have a combined in-plane thermal conductivity of less than about 20 W K$^{-1}$ m$^{-1}$.

The invention further includes a nanodevice comprising at least three layers of ALD-generated material, including at least one ALD-generated electrically conducting layer and at least two ALD-generated insulating material layers, wherein the at least one electrically conducting layer is located between the at least two insulating material layers. The invention further includes a nanodevice comprising at least two ALD-generated electrically conducting layers and at least one ALD-generated insulating material layer, wherein the at least one insulating material layer is located between the at least two ALD-generated electrically conducting layers. In certain embodiments, electrical connection takes place in between the conducting layers through the at least one insulating material layer, allowing electron transport between the at least two ALD-generated electrically conducting layers.

The invention further includes a nanodevice comprising at least two layers of ALD-generated material and at least one electrically conducting solid material layer, wherein at least one of the at least two ALD-generated material layers independently comprises an insulating material layer, and the remaining layer(s) of ALD-generated material independently comprises an electrically conducting ALD-generated material layer, wherein the at least one ALD-generated insulating material layer is located between the electrically conducting solid material layer and the electrically conducting ALD-generated material layer, wherein electrical connection takes place through the at least one ALD-generated insulating layer, between the electrically conducting solid material layer and the electrically conducting ALD-generated material layers, allowing for electron transport between the electrically conducting layers of the nanodevice.

In certain embodiments, the ALD-generated material comprises a multitude of layers of insulating and conducting materials, wherein an insulating material layer is in contact with the at least one electrically conducting layer. In other embodiments, the electrically conducting material layer comprises aluminum. In yet other embodiments, the electrically conducting additional solid material layer(s) is one or more solid supporting material layers as described elsewhere herein. In yet other embodiments, electrical conduction occurs among layers in the device. In yet other embodiments, one of the ALD-generated materials is an electrically insulating material and is in physical contact with the additional solid material layer(s). In yet other embodiments, the insulating layer comprises $Al_2O_3$. In yet other embodiments, the insulating layer comprises at least one selected from the group consisting of $TiO_2$, $SiO_2$, and $HfO_2$. In yet other embodiments, the insulating layer is about 0.1 nm to 10 nm thick. In yet other embodiments, the additional solid material layer(s) comprise(s) one or more ALD-generated layers.

In certain embodiments, one or more ALD-generated conducting layer is at least one selected from the group consisting of W, Ru, Mo, Ta, Pt, ZnO, Si, and GaN. In other embodiments, electrical connection is achieved from a solid supporting material layer to an ALD-generated conductor. In yet other embodiments, electrical connection is achieved from an ALD-generated conductor to a solid supporting material layer. In yet other embodiments, the electron transport occurs by electron tunneling. In yet another embodiment, the electron transport occurs by dielectric breakdown within the ALD-generated insulator material.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Example 1

Electrical Layer Processing:

The electrical layer was formed via lift-off patterning with negative photoresist. After pattern exposure and development, an aluminum film nominally 100 nm in thickness was evaporated, followed by lift-off performed using an ultrasonic bath.

Polyimide Processing:

An adhesion promotion chemical was applied to the substrate and polyimide was spun onto the adhesion layer. The resultant structure was then cured at elevated temperatures. In non-limiting embodiments, thicknesses of the structure using the process were typically from about 2.5 µm to about 4.5 µm. Vias and trenches were both etched utilizing a thermally evaporated 100-nm aluminum mask, which was patterned using negative photoresist and lift-off processing. The etch was done using anisotropic reactive ion etching (RIE) with $O_2$ plasma. The aluminum mask was removed in etchant.

ALD:

$Al_2O_3$/W/$Al_2O_3$ ALD (atomic layer deposition) depositions occurred in a custom-fabricated reaction chamber with gas leads for W and $Al_2O_3$ precursors and processing at 130° C. $Al_2O_3$/Ru/$Al_2O_3$ ALD depositions occurred in a Beneq TFS 200 commercial reactor at 300° C. The $Al_2O_3$ deposition used trimethylaluminum (TMA) and $H_2O$ as gas precursors for growth at 0.11 nm/cycle. The W deposition used $Si_2H_6$ and $WF_6$ as gas precursors for growth at 0.384 nm/cycle. The Ru deposition used thermally activated $Ru(EtCp)_2$ and $O_2$ at 110° C. as gas precursors for growth at about 0.04 nm/cycle.

Patterning of Layer Formed by ALD:

The ALD lithography was accomplished using a positive photoresist. Each ALD film was etched by anisotropic reactive ion etch (RIE) using fluorine-based chemistry. The photoresist was removed in an acetone bath.

Figure 5A:
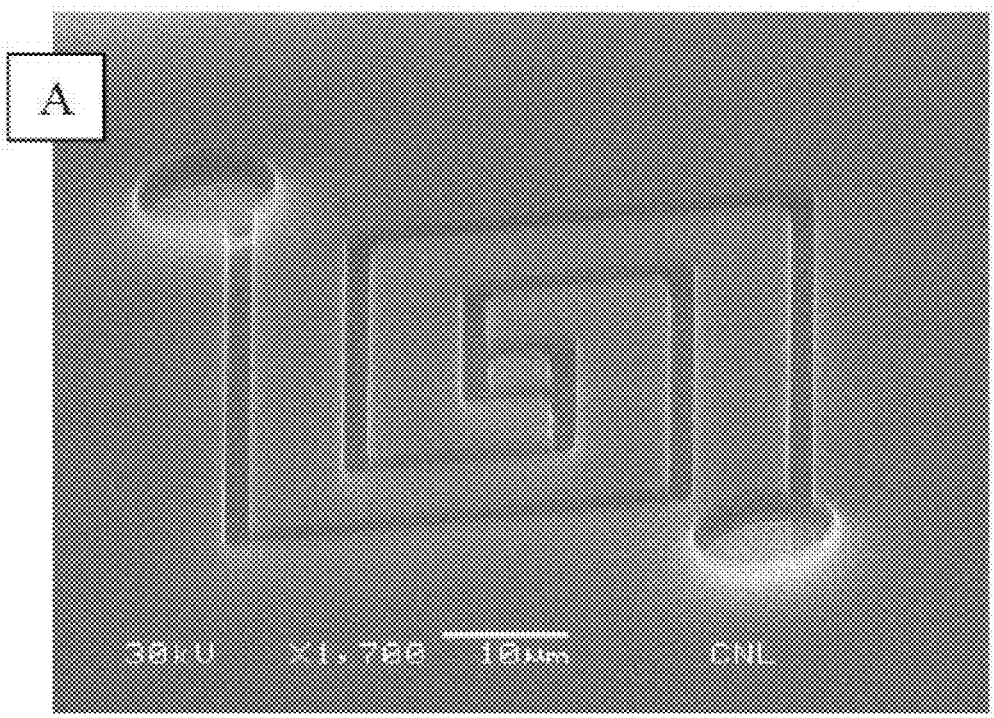
FIG. 5A is a non-limiting SEM image illustrating a via mold connected to the electrical layer and smooth trench mold.
Figure 5B:
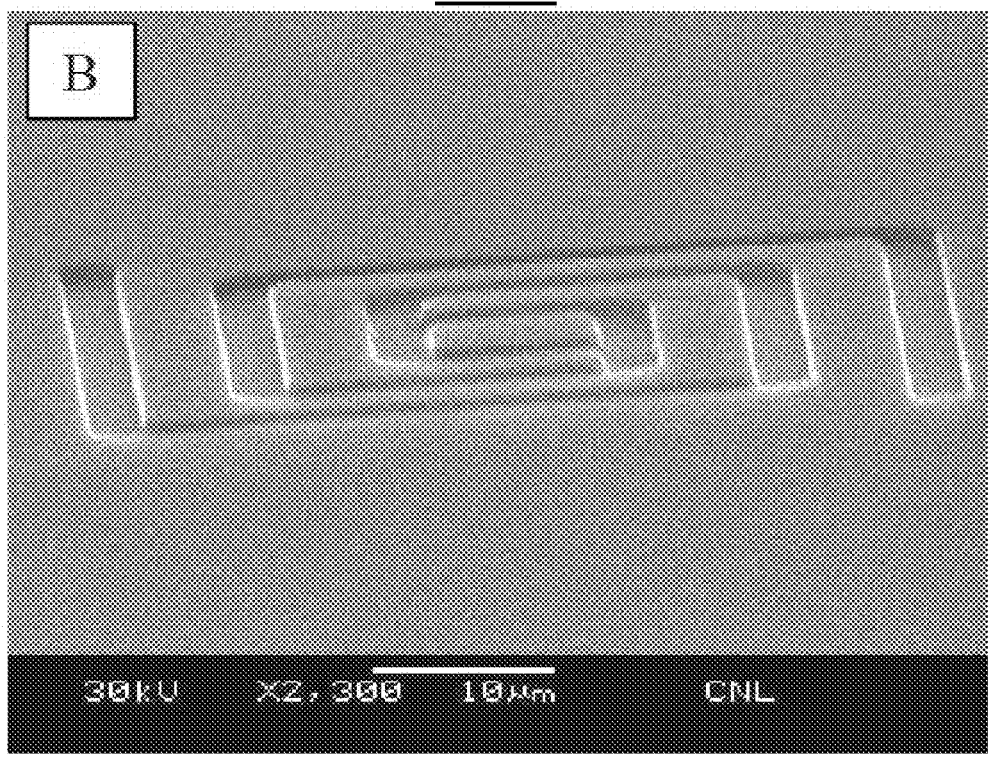
FIGS. 5B-5C are non-limiting SEM images illustrating a smooth trench mold.
Figure 5C:
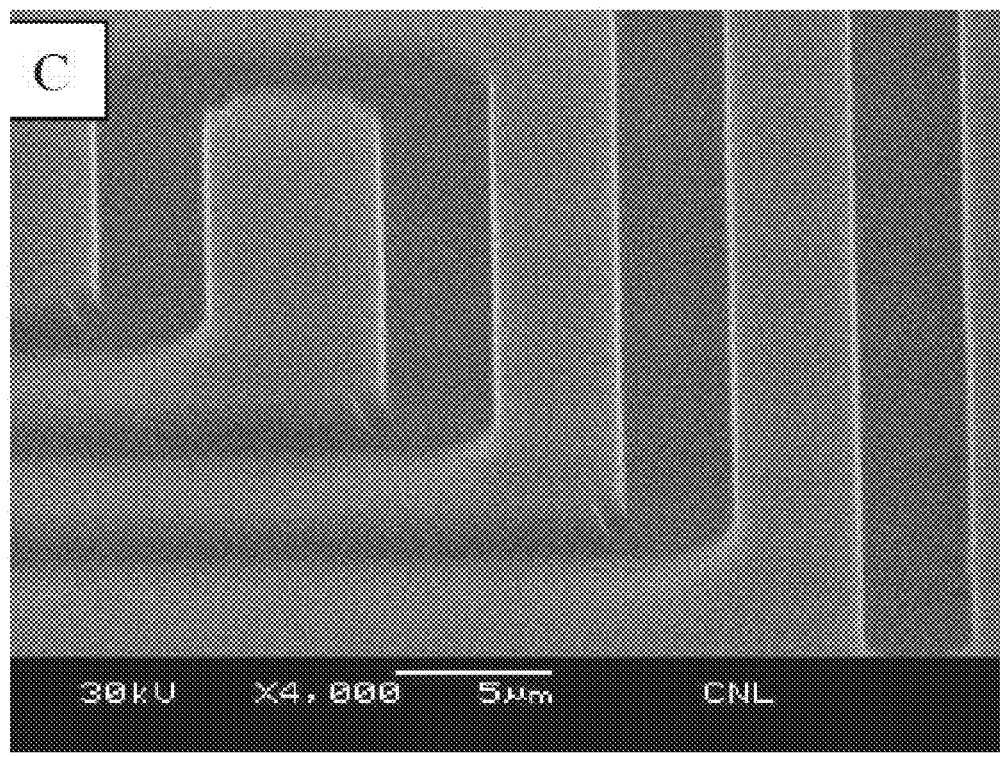
Figure 6A:
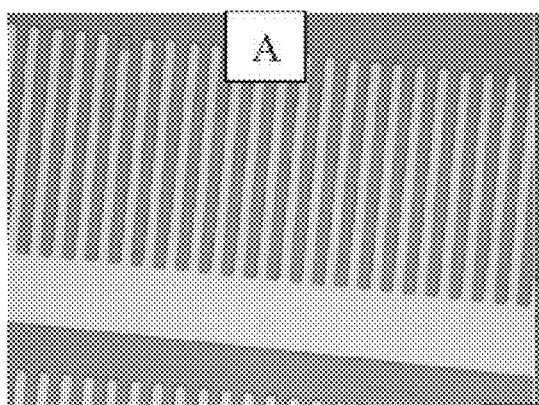
FIGS. 6A and 6B is non-limiting optical microscope images illustrating the before and after $O_2$ release etch of $Al_2O_3/W$ cantilever structures (no capping layer).
Figure 6B:
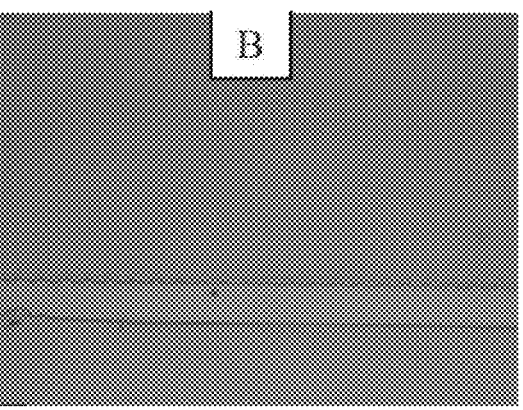
Figure 6C:
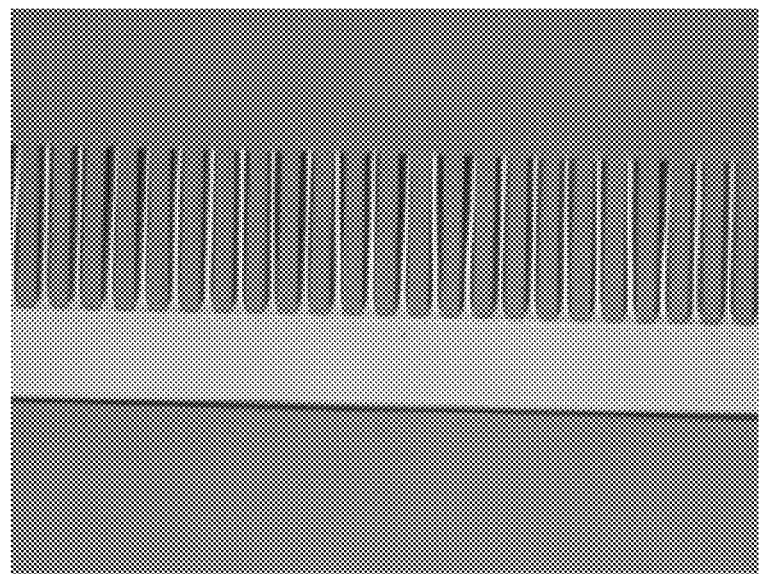
FIG. 6C is an optical microscope image illustrating the post-$O_2$ release etch of $Al_2O_3/W/Al_2O_3$ cantilever structures (capping layer included).

FIGS. 5A-5C illustrate smooth trench molds and a via mold connection to the electrical layer and a trench mold. FIGS. 6A-6B illustrate the before and after $O_2$ release etch of $Al_2O_3$—W cantilever structures (no capping layer). FIG. 6B illustrates that the reflective W layer was completely removed during the release etch without a protective capping layer. FIG. 6C illustrates identical cantilevers with a $Al_2O_3$ capping layer and shows W remains.

Figure 7:
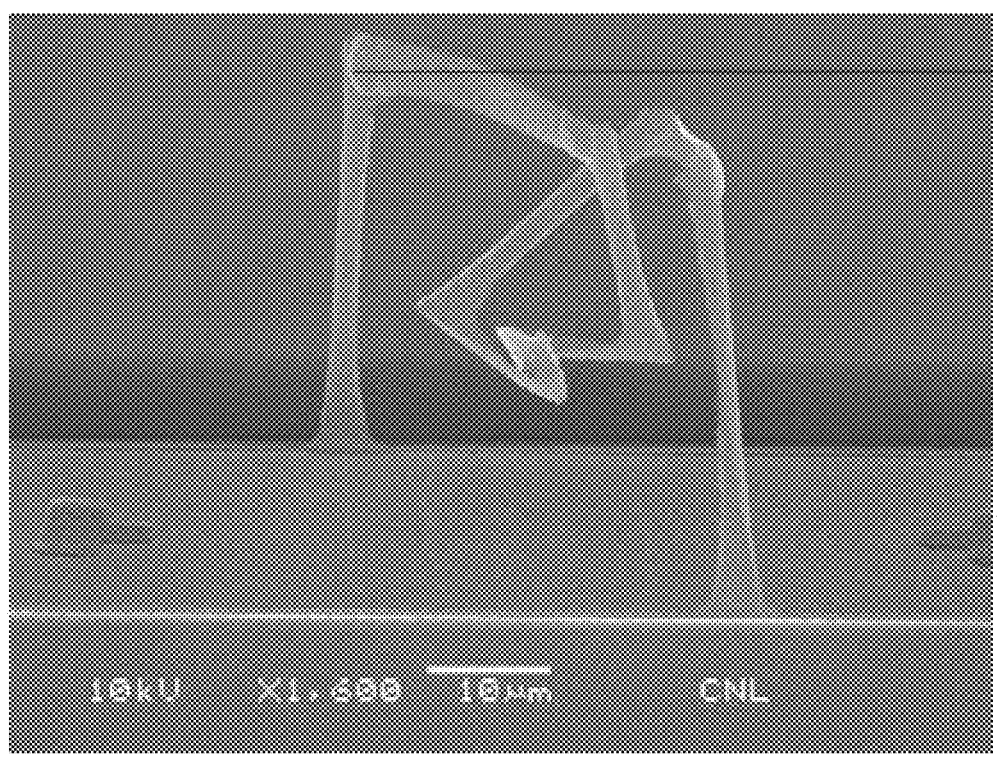
FIG. 7 is a non-limiting illustration of the result of the exposure of ALD-generated layers to high temperature etching conditions.

Release Processing:

The patterned ALD was released by removing the polyimide in an oxygen-based microdevice asher. In certain embodiments, the polyimide etch was temperature sensitive, and etch times were limited to 20 minutes, during which the samples were heated to about 120° C. The etch rates varied, and in certain embodiments were on the order of about 0.05 µm/min. The majority of etching occurred at the end of the 20 minute cycle as the samples were heated. Harsh conditions due to overheating of the released devices may result in a deformed structure upon release (FIG. 7).

Figure 4C:
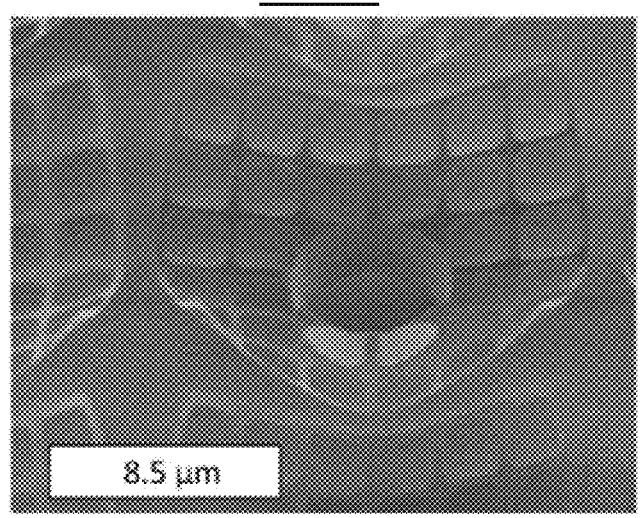
FIGS. 4C-4E are non-limiting SEM images of suspended membranes and schematics of their cross-sections for microbolometer applications.
Figure 4C:
Figure 4D:
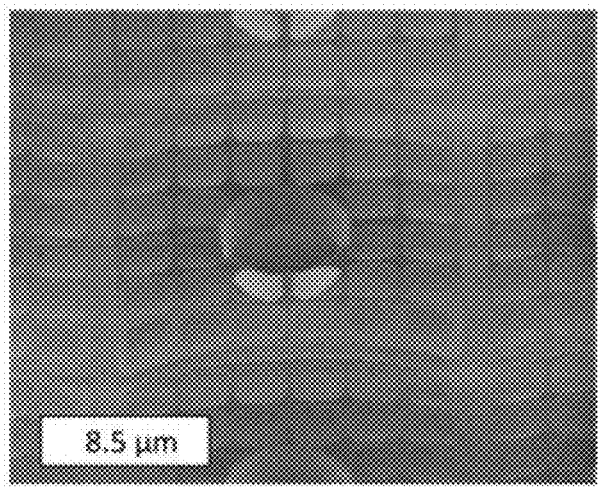
Figure 4D:
Figure 4E:
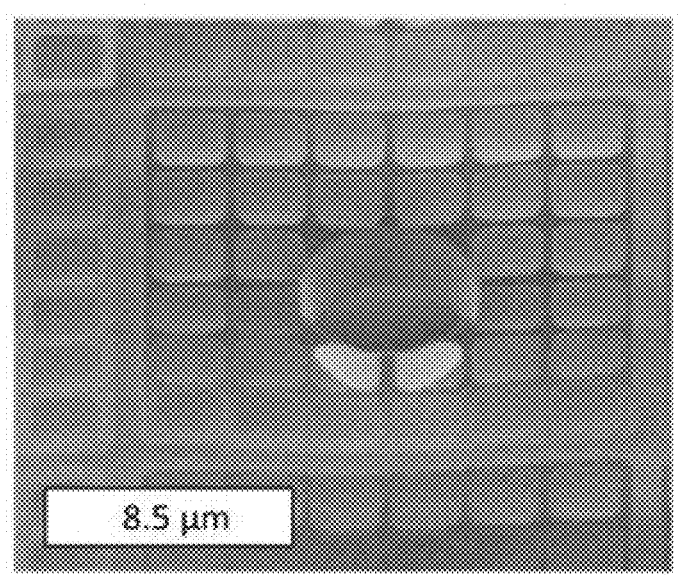
Figure 4E:
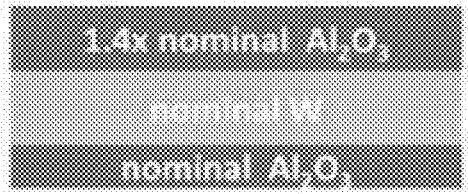

Micro Bolometer:

In another aspect, the nanodevices and/or microdevices described may be used as infrared absorption structures in microbolometers. Using the process outlined in FIG. 1A (excluding trenches) the absorption structure of $Al_2O_3$/W/$Al_2O_3$ with several thicknesses for the top $Al_2O_3$ layer as shown in FIGS. 4C-4E, and a centered mechanical via was fabricated. This structure results in an approximately 30% increase in microbolometer performance over conventional fabrication approaches due to the drastic reduction in total thickness.

FIG. 4A is a non-limiting example of a suspended $Al_2O_3$/Ru/$Al_2O_3$ fixed-free cantilever arrays for curl measurements. The inset in FIG. 4A shows a magnified view of curled structures anchored to polyimide. Both images were taken at 60° angle. FIG. 4B is a graph of the cantilever curvature relates to thickness measured from samples depicted in FIG. 4A. FIGS. 4C-4E are images of suspended membranes for microbolometer applications. The membranes have a cross section of $Al_2O_3$ and W. The bottom $Al_2O_3$ layer and the W layer were kept constant in thickness while the top $Al_2O_3$ layer was varied in thickness. In the FIGs. each square structure is 16 µm×16 µm. Equal top and bottom $Al_2O_3$ thicknesses resulted in an upward curl, while a two times thicker top layer resulted in a downward curl. A flat structure is achieved with a top $Al_2O_3$ layer that is about 1.4 times thicker than the bottom $Al_2O_3$ layer. The images of FIGS. 4C-4E were taken at 45° angle.

The results described herein demonstrate a new method for top-down N/MEMS manufacturing with three-dimensional features and property control, and atomically controlled curl tuning. The process is extendable to multiple levels, enabling the possibility of complex hierarchical systems. New opportunities for such devices are enabled by this process wherein the lateral pattern is curled to generate non-planar structures. Further, the multi-level process combined with targeted stress relief could enable complex 3-D meta-material structures. Prior to release, the sample may be coated with biological or chemical particulates to be trapped by flower petal structures upon release and even an electromechanical actuation scheme realized. Helical structures from this process target applications such as nanoscale flagellum motors for magnetically controlled bio-implantation devices or 3-D helical chiral meta-materials. Currently, helical structures are only achievable by time-consuming direct laser writing or self-scrolling methods with limited material selection. This process has also aided in enhancing microbolometer performance by incorporating ultra-thin materials. In certain embodiments, improvements in lithography will enable suspended nanodevices with volumetric footprints on the order of tens of nanometers and may be expected to impact the development of visible frequency meta-materials, optical tuning devices and standard electronics.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of generating a nanodevice comprising a multilevel suspended ALD structure, the method comprising:

(a) coating at least a portion of a first solid supporting material layer with a thin solid material using atomic layer deposition (ALD), thus forming a first ALD-generated thin solid material layer;

(b) patterning the first ALD-generated thin solid material layer;

(c) adding an additional solid supporting material layer to the first ALD-generated thin solid material layer;

(d) patterning the additional solid supporting material layer;

(e) coating the additional patterned solid supporting material layer with a second thin solid material using ALD, thus forming a second ALD-generated thin solid material layer;

(f) patterning the second ALD-generated thin solid material layer to form the nanodevice; and, (g) releasing at least a portion of the nanodevice from the solid supporting material layers, thereby generating a multilevel suspended ALD structure.

2. The method of claim 1, wherein at least one selected from the group consisting of the first solid supporting material layer and the additional solid supporting material layer comprises at least one selected from the group consisting of a polyimide, a polymethyldisiloxane, a polystyrene, an epoxy, a polypropylene, a poly(methylmethacrylate), a polyethylene, and a poly(vinyl chloride).

3. The method of claim 1, further comprising patterning the first solid supporting layer before the additional solid supporting material layer is patterned.

4. The method of claim 1, wherein at least one selected from the group consisting of the first and the second ALD-generated thin solid material layers comprises at least one selected from the group consisting of a metal, a metal oxide, a semimetal, a semiconductor, and a metal nitride.

5. The method of claim 1, wherein at least one selected from the group consisting of the first and the second ALD-generated thin solid material layers comprises at least one selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, $RuO_2$, Si, SiC, SiGe, $SiO_2$, $SnO_2$, Ta, Ti, TiN, $TiO_2$, $V_2O_5$, $VO_x$, W, ZnO, and $ZrO_2$.

6. The method of claim 1, wherein at least one of the solid supporting material layers is deposited by at least one method selected from the group consisting of evaporation, electroplating, plasma enhanced chemical vapor deposition, reactive ion beam deposition, and atomic layer deposition.

7. The method of claim 1, wherein at least one selected from the group consisting of the first and the second ALD-generated layers comprises a dielectric layer and/or a metal layer.

8. The method of claim 1, wherein at least one selected from the group consisting of the first and the second ALD-generated layers has a thickness ranging from about 0.1 nm to about 300 nm.

9. The method of claim 1, wherein at least one selected from the group consisting of the first and the second ALD-generated layers comprises at least two layers, each layer independently comprising Ru, W, Pt, $Al_2O_3$, $SiO_2$, ZnO, or $TiO_2$.

10. The method of claim 1, wherein step (g) comprises at least partial removal of at least one solid supporting material layer by wet or dry etching.

11. The method of claim 1, wherein the method further comprises:

depositing and patterning an electrically conducting layer on the first solid supporting material layer.

12. The method of claim 11, wherein the electrically conducting layer comprises at least one selected from the group consisting of Ag, Al, Au, Cr, Cu, Ni, Pt, Si, Ti, Ta, W, and an alloy containing one or more of these metals.

13. The method of claim 1, wherein the first solid supporting material layer comprises at least one selected from the group consisting of Si, $SiO_2$, glass, $Si_3N_4$, sapphire, GaAs, SiC, and a solid organic material.

14. A nanodevice prepared according to the method of claim 1.

15. The nanodevice of claim 14, which is a bolometer, a transducer, a temperature sensor, a thermistor, a microbolometer, a microphone, a speaker, an ultrasonic transducer, a resistor, an inductor, a spiral inductor, a flagellum, a flagellum motor, a freestanding nanodevice, a freestanding microdevice, a Bragg reflector, a Bragg filter, an antenna, a terahertz detector, an electromagnetic transformer, or an electrical system.

16. The nanodevice of claim 15, wherein the nanodevice is a bolometer comprising a radiation absorbing device and bolometer support structure, comprising ALD-generated layers, which is connected to a non-ALD-generated transducing layer.

17. The nanodevice of claim 16, wherein the radiation absorbing device is connected to the non-ALD-generated transducer layer and connected to the support structure and an underlying read-out integrated circuit to form an entire bolometer device.

18. The nanodevice of claim 14, which is a radiation absorbing device or bolometer support structure.

19. The nanodevice of claim 14, having a heat capacity less than about 200 pJ/K.

20. The method of claim 1, wherein the additional solid supporting material layer formed in step (d) is patterned to create vias, trenches or other three-dimensional templates.

21. A method of generating a nanodevice, the method comprising:

(a) coating at least a portion of a solid supporting material layer with a thin solid material layer using atomic layer deposition (ALD), thus forming an ALD-generated thin solid material layer;
(b) patterning the thin solid material layer, thus forming a nanodevice; and,
(c) releasing at least a portion of the nanodevice from the solid supporting material layer, thereby generating a suspended ALD structure.

22. The method of claim 21, wherein the solid supporting material layer comprises at least one selected from the group consisting of a polyimide, a polymethyldisiloxane, a polystyrene, an epoxy, a polypropylene, a poly(methylmethacrylate), a polyethylene, and a poly(vinyl chloride).

23. The method of claim 21, further comprising patterning the solid supporting layer before coating with the thin solid material.

24. The method of claim 21, wherein the ALD-generated thin solid material layer comprises at least one selected from the group consisting of a metal, a metal oxide, a semimetal, a semiconductor, and a metal nitride.

25. The method of claim 21, wherein the ALD-generated thin solid material layer comprises at least one selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, $RuO_2$, Si, SiC, SiGe, $SiO_2$, $SnO_2$, Ta, Ti, TiN, $TiO_2$, $V_2O_5$, $VO_x$, W, ZnO, and $ZrO_2$.

26. The method of claim 21, wherein the solid supporting material layer is deposited by at least one method selected from the group consisting of evaporation, electroplating, plasma enhanced chemical vapor deposition, reactive ion beam deposition, and atomic layer deposition.

27. The method of claim 21, wherein the ALD-generated layer comprises a dielectric layer and/or a metal layer.

28. The method of claim 21, wherein the ALD-generated layer has a thickness ranging from about 0.1 nm to about 300 nm.

29. The method of claim 21, wherein the ALD-generated layer comprises at least two layers, each layer independently comprising Ru, W, Pt, $Al_2O_3$, $SiO_2$, ZnO, or $TiO_2$.

30. The method of claim 21, wherein step (c) comprises at least partial removal of the solid supporting material layer by wet or dry etching.

31. The method of claim 21, wherein the method further comprises depositing and patterning an electrically conducting layer on the solid supporting material layer.

32. The method of claim 31, wherein the solid supporting material layer comprises at least one selected from the group consisting of Si, $SiO_2$, glass, $Si_3N_4$, sapphire, GaAs, SiC, and a solid organic material.

33. The method of claim 31, wherein the electrically conducting layer comprises at least one selected from the group consisting of Ag, Al, Au, Cr, Cu, Ni, Pt, Si, Ti, Ta, W, and an alloy containing one or more of these metals.

34. A nanodevice prepared by according to the method of claim 21.

35. The nanodevice of claim 34, which is a bolometer, a transducer, a temperature sensor, a thermistor, a microbolometer, a microphone, a speaker, an ultrasonic transducer, a resistor, an inductor, a spiral inductor, a flagellum, a flagellum motor, a freestanding nanodevice, a freestanding microdevice, a Bragg reflector, a Bragg filter, an antenna, a terahertz detector, an electromagnetic transformer, or an electrical system.

36. The nanodevice of claim 34, which is a radiation absorbing device or bolometer support structure.

37. The nanodevice of claim 34, wherein the nanodevice is a bolometer comprising a radiation absorbing device and bolometer support structure, comprising ALD-generated layers, which is connected to a non-ALD-generated transducing layer.

38. The nanodevice of claim 37, wherein the radiation absorbing device is connected to the non-ALD-generated transducer layer and connected to the support structure and an underlying read-out integrated circuit to form an entire bolometer device.

39. The nanodevice of claim 34, having a heat capacity less than about 200 pJ/K.

40. A method of generating a nanodevice, the method comprising:
(a) depositing an electrically conducting layer on a substrate;
(b) patterning the electrically conducting layer;
(c) coating the patterned electrically conducting layer with a polymer layer;
(d) patterning the polymer layer to provide a patterned polymer layer;
(e) depositing at least one additional layer selected from an ALD-generated layer and a non-ALD generated layer, on the patterned polymer layer thus forming a nanodevice; and,
(f) releasing at least a portion of the nanodevice by removing the polymer layer, thereby generating a suspended structure.

41. The method of claim 40, further comprising patterning the non-ALD generated layer before releasing.

42. The method of claim 40, wherein the substrate comprises at least one selected from the group consisting of Si, $SiO_2$, glass, $Si_3N_4$, sapphire, GaAs, SiC, and a solid organic material.

43. The method of claim 40, wherein the electrically conducting layer comprises at least one selected from the group consisting of Al, Cu, Ti, Ni, Cr, Au, Pt, Ag, Ge, SiGe, SiC, TiN, Ta, indium tin oxide, $SnO_2$, ZnO, Si, and an organic conductor.

44. The method of claim 40, wherein the polymer layer comprises at least one selected from the group consisting of a polyimide, a polymethyldisiloxane, a polystyrene, an epoxy, a polypropylene, a poly(methylmethacrylate), a polyethylene, and a poly(vinyl chloride).

* * * * *